US012615719B2

(12) United States Patent
Price et al.

(10) Patent No.: US 12,615,719 B2
(45) Date of Patent: Apr. 28, 2026

(54) ELECTRONIC CIRCUIT ASSEMBLIES, METHODS OF MANUFACTURING THE SAME, AND MODULES

(71) Applicant: PRAGMATIC SEMICONDUCTOR LIMITED, Cambridge (GB)

(72) Inventors: Richard Price, Sedgefield (GB); Brian Cobb, Sedgefield (GB); Laurence Scullion, Sedgefield (GB); Melanie Winter, Sedgefield (GB); Neil Davies, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 179 days.

(21) Appl. No.: 18/037,495

(22) PCT Filed: Nov. 24, 2021

(86) PCT No.: PCT/GB2021/053043
§ 371 (c)(1),
(2) Date: May 17, 2023

(87) PCT Pub. No.: WO2022/112754
PCT Pub. Date: Jun. 2, 2022

(65) Prior Publication Data
US 2023/0422404 A1 Dec. 28, 2023

(30) Foreign Application Priority Data
Nov. 25, 2020 (GB) ...................................... 2018549

(51) Int. Cl.
*H05K 1/18* (2006.01)
*H05K 1/14* (2006.01)
(Continued)

(52) U.S. Cl.
CPC ............. *H05K 3/323* (2013.01); *H05K 1/147* (2013.01); *H05K 1/189* (2013.01)

(58) Field of Classification Search
CPC ......... H05K 3/323; H05K 1/147; H05K 1/189
(Continued)

(56) References Cited

U.S. PATENT DOCUMENTS 5,903,056 A * 5/1999 Canning ................. H01L 24/83
257/E21.511
6,297,868 B1 10/2001 Takenaka et al.
(Continued)

FOREIGN PATENT DOCUMENTS

GB 2576524 A 2/2020
JP H03-232233 A 10/1991
(Continued)

OTHER PUBLICATIONS

International Search Report for International Application No. PCT/GB2021/053043, mailed Feb. 28, 2022.
(Continued)

*Primary Examiner* — Binh B Tran
(74) *Attorney, Agent, or Firm* — Jason H. Vick; Amped IP LLC

(57) ABSTRACT

An electronic circuit assembly comprises: a first electronic circuit module; a second electronic circuit module; and a quantity of anisotropic conductive adhesive, ACA, comprising a plurality of electrically conductive particles and an electrically non-conductive adhesive, arranged to bond the first electronic circuit module to the second electronic circuit module. The first electronic circuit module comprises a first surface and a first pair of electrical contacts each provided on said first surface, the second electronic circuit module comprises a second surface and a second pair of electrical contacts each provided on said second surface, said first
(Continued)

15 FlexIC circuits   20   1 FlexIC
11 FlexIC contact   12 FlexIC contact
3 ACA   3 ACA
2   21   10   22   23
Application circuit   Application circuit contact   Application circuit   Application circuit contact
Application circuit conductors surface is arranged to face said second surface, said first pair of electrical contacts is aligned with said second pair of electrical contacts such that a first electrical contact of the first pair opposes a first electrical contact of the second pair and a second electrical contact of the first pair opposes a second electrical contact of the second pair, said quantity of ACA occupies a volume between the first and second surfaces, and conductive particles of the ACA provide a first electrical connection between the first electrical contacts of the first and second pairs, and a second electrical connection between the second electrical contacts of the first and second pairs. The first electronic circuit module further comprises at least one member provided on and protruding from said first surface and arranged between the first pair of electrical contacts, and at least one channel provided through a said member or defined between a plurality of said members, each said channel providing a flow channel, in a direction parallel to the first surface, for at least said non-conductive adhesive during manufacture of the assembly.

16 Claims, 13 Drawing Sheets

(51) Int. Cl.
*H05K 1/189* (2026.01)
*H05K 3/321* (2026.01)

(58) Field of Classification Search
USPC .......................................................... 361/749
See application file for complete search history.

(56) References Cited

U.S. PATENT DOCUMENTS

| | | | |
|---|---|---|---|
| 2006/0100314 A1* | 5/2006 | Arifuku | H01L 24/83 |
| | | | 523/210 |
| 2008/0123041 A1 | 5/2008 | Fujita | |
| 2009/0153765 A1* | 6/2009 | Yamashita | H05K 3/323 |
| | | | 361/679.21 |
| 2011/0103034 A1 | 5/2011 | Huang et al. | |
| 2011/0139501 A1 | 6/2011 | Ching-San et al. | |
| 2015/0098036 A1 | 4/2015 | Saitou | |
| 2018/0063956 A1* | 3/2018 | Min | H05K 1/028 |
| 2020/0321510 A1 | 10/2020 | Kakluchi | |

FOREIGN PATENT DOCUMENTS

| | | |
|---|---|---|
| JP | H09-45731 A | 2/1997 |
| JP | 2004-087805 A | 3/2004 |
| JP | 2010-232342 A | 10/2010 |
| JP | 2012-191015 A | 10/2012 |

OTHER PUBLICATIONS

Written Opinion for International Application No. PCT/GB2021/053043, mailed Feb. 28, 2022.
Combined Search and Examination Report Under Sections 17 and 18(3) for corresponding Great Britain Application No. 2018549.2, mailed May 11, 2021.
International Preliminary Report on Patentability for International Application No. PCT/GB2021/053043, mailed Jun. 8, 2023.
Notification of the Reasons for Rejection (Including Translation) for corresponding Korean Patent Application No. 10-2023-7021111, mailed Jul. 11, 2025.
Notice of Reasons for Refusal (Including Machine Translation) for corresponding Japanese Patent Application No. 2023-532667, mailed Sep. 16, 2025.

* cited by examiner

ELECTRONIC CIRCUIT ASSEMBLIES, METHODS OF MANUFACTURING THE SAME, AND MODULES

CROSS-REFERENCE TO RELATED APPLICATIONS

This application is a national stage application under 35 U.S.C. 371 of PCT Application No. PCT/GB2021/053043 having an international filing date of 24 Nov. 2021, which designated the United States, which PCT application claimed the benefit of Great Britain Application No. 2018549.2, filed 25 Nov. 2020, each of which are incorporated herein by reference in their entirety.

FIELD OF THE INVENTION

Certain aspects of the invention relate to electronic circuit assemblies comprising first and second electronic circuit modules bonded together using anisotropic conductive adhesive (ACA), to electronic circuit modules for use in such assemblies, and to methods of manufacturing such assemblies. Certain aspects relate generally to the field of electrical circuits and microchips. Certain aspects relate to an improved electronic structure, such as, for example, a flexible Integrated Circuit (IC), that is adapted for bonding with an external circuit, or to improved external circuits to which flexible ICs may be bonded.

BACKGROUND TO THE INVENTION

A variety of electronic circuit assemblies comprising a first electronic circuit module bonded to a second electronic circuit module are known. These include assemblies where electrical contact needs to be made between at least one electrical contact on the first module and at least one respective electrical contact on the second module. It is known to use a variety of techniques for bonding such modules together, and making the requisite electrical connections, one known technique being to use anisotropic conductive adhesive (ACA) which comprises a plurality of electrically conductive particles held in a non-conductive, initially fluid, adhesive. In certain assemblies, at least one of the electronic circuit modules may be flexible, such as a flexible integrated circuit (also known as a FlexIC), and the module to which it is attached may be flexible or substantially rigid. In assemblies comprising a flexible integrated circuit and another circuit module, the other circuit module may be referred to as an application circuit, that is a circuit module to which the flexible integrated circuit module is applied. In general, the application circuit may, of course, be flexible itself, or substantially rigid.

In the past decade, flexible circuitry has been branching out significantly from its initial role as a simple wire replacement to providing very cost-effective, but more complex interconnects, as well as, low-cost flexible integrated circuits (ICs) that can easily be embedded into everyday objects.

A flexible circuit structure, such as, for example, a flexible integrated or printed circuit (i.e. IC), may be a patterned arrangement of circuitry and components that utilises flexible base material with or without flexible overlay. In particular, the flexible circuit structure (e.g. flexible IC) may be formed in a thin layer of soft polymer film so that the flexible circuit structure can be bent or even stretched while maintaining integrity and functionality of the integrated circuit. Also, in contrast to a rigid silicon wafer IC, flexible circuit structures have usually no further protection, such as a hard, outer plastic case, and may therefore be vulnerable to damage.

As the demands of modern electronic systems call for increasing functionality, greater circuit density, higher connectivity, better environmental performance, and all at low-cost, flexible circuit structures are constantly improved and/or adapted to be embedded into or combined with external application circuits. For example, flexible circuit structures (e.g. flexible ICs) may be attached to an external application circuit, so as to support/enhance the application circuit, or to provide additional functionality. Typically, as mentioned above, anisotropic conductive adhesive (ACA, also referred to as anisotropic conductive paste (ACP), anisotropic conductive film (ACF) and z-axis adhesive) is used to operably attach the flexible circuit structure to the application circuit.

ACA typically consists of a non-conductive adhesive (e.g. an adhesive organic binder) with a filling material of conductive particles forming a paste. In general, the ACA is placed between a flexible circuit structure and respective contacts of an application circuit. A bonding tool (e.g. thermodes) is then used to press (while applying heat) the conductive particles into respective contacts of the flexible circuit structure and the application circuit forming an electrically conductive interface between the flexible circuit structure and the application circuit. Since the conductive particles are isolated within the non-conductive adhesive matrix, no lateral conduction takes place. The binder cures thermally to secure the bond between the flexible circuit structure and the application circuit.

One advantage of using ACA is that it allows the assembly of flexible circuit structures and external circuits without the need for an accurate (and hence time-consuming and/or costly) placement of a conductive adhesive onto the small engaging contacts. In fact, the adhesive (i.e. ACA) may cover the whole area of the flexible circuit structure without the risk of causing a short circuit, because the electrically conductive particles are adapted to only provide a conductive interface between the desired electrical connections of the flexible circuit structure and the application circuit. In addition, when using ACA, there is no need to apply an additional non-conductive adhesive to provide mechanical integrity to the flexible circuit structure/application circuit assembly.

Thus, FlexICs are typically attached to an application circuit using an Anisotropic Conductive Adhesive (ACA). For successful attachment the ACA needs to fully cover the interface between the FlexIC and the application circuit, i.e. leaving no unattached areas of the FlexIC or cavities in the ACA layer. In order to minimise materials consumption it is desirable to apply a small amount of ACA and cause it to flow across the interface. This may be relatively straightforward for application circuits that are substantially flat across the interface with the FlexIC, however some application circuits have raised features that may impede the flow of ACA along/across the interface. An example of such an application circuit has one or more raised conductors running along or across the surface onto which the FlexIC is attached, as illustrated in FIG. 1. In this example, the flexIC is a first electronic circuit module of the assembly and comprises a first surface (facing downwards in the figure) on which a first pair of electrical contacts is provided. The flexIC comprises a flexible substrate or body which supports or encapsulates a flexible integrated circuit which is coupled to the first pair of electrical contacts. The second electronic circuit module in this example is the application circuit, which comprises a substrate or body having a second surface (it's upper surface in the figure) upon which are provided a second pair of electrical contacts and a plurality of application circuit conductors arranged between that second pair of contacts. These conductors may, for example, be antenna tracks or other conductive elements of the second circuit module, or indeed may be any other electrical, electronic, insulative, or mechanical features of the second circuit module. FIG. 1 shows the assembly part way through manufacture. A quantity of ACA 3 has been deposited over the first and second contacts of the second pair 21, 22, in the form of two spots or drops. The first circuit module 1 has been arranged such that its first surface 10 faces the second surface 20, and the first pair of contacts 11, 12 is aligned with the second pair of contacts. The first and second surfaces are then urged together. However, as the FlexIC is pressed onto the application circuit, the raised application circuit conductors 23 (or other raised members/components/elements/features between the second pair of contacts) block the flow of ACA away from its initial deposition areas (generally over the contacts) and inhibit the ACA from spreading across the whole interface between the FlexIC and application circuit.

This is undesirable because it can result in certain portions of the first circuit module remaining unattached to the application circuit due to the creation of cavities in the adhesive layer. Furthermore, it can result in the arrangement shown in FIG. 2, where a central portion of the flexible first circuit module has been bent as a result of the force applied to urge the first and second surfaces together, because that central portion is unsupported by ACA which has been inhibited from flowing over the central region of the application circuit, between its pair of contacts, by the blocking application circuit conductors (or other such features).

A further problem associated with the use of ACA to bond first and second circuit modules together, particularly when the first circuit module is flexible, is illustrated in FIGS. 3 and 4. When using ACA for bonding, thermodes are typically required to apply a relatively high pressure so as to squeeze the adhesive layer (ACA) provided between the flexible circuit structure and the application circuit until the adhesive layer (ACA) is a little thinner than the diameter of the conductive particles. While this technique works sufficiently well for rigid silicon chips and other rigid or some flexible circuits, many flexible circuit structures may only have a relatively soft and/or very thin (e.g. <1 μm) protective layer between the embedded circuitry (e.g. IC) and the adhesive layer.

Consequently, there is a real danger of the conductive particles (which may be several μm in diameter) to be pressed into the flexible circuit structure's circuit component(s), thus, potentially causing structural damage, short circuits, open circuits and/or other damage to the flexible circuit structure.

FIGS. 3 and 4 show a simplified illustration of the described bonding technique using thermodes 100a, 100b and an Anisotropic Conductive Adhesive (ACA) layer 120 to operably attach a flexible circuit structure (i.e. a flexible IC) 140 to an application circuit 160 (e.g. an external circuit).

During assembly, the ACA 120 is provided between respective interface surfaces (each comprising circuit contact elements 180, 200) of the flexible circuit structure 140 and the application circuit 160, wherein an upper thermode 100a and a lower thermode 100b are placed on respective outer surfaces of the flexible circuit structure 140 and the application circuit 160. Upper and lower thermodes 100a, 100b provide a predetermined force by pressing the flexible circuit structure 140 and the application circuit 160 together while applying a predetermined heat energy. Applied heat and pressure cause the ACA 120 to flow so that conductive particles 220 are trapped between corresponding contact elements 180, 200, thus, forming a localised electrical connection between corresponding contact elements 180 and 200. As illustrated in FIG. 4, under pressure (and heat) conductive particles 220 may penetrate the flexible substrate 240 potentially damaging the embedded circuitry 260 or any circuit component.

FIG. 5 illustrates a partial solution to the problem of conductive particles damaging the internal components or circuitry of the flexible circuit module. This partial solution is to provide a shield member 1100 on the first surface 1080 of the first circuit module 140, between the first pair of electrical contacts 180. The size and extent of the shield member corresponds to the size and extent of the internal components 260 to be protected, and the shield member is formed from a material suitable to prevent conductive particles of the ACA from penetrating through the shield member during the assembly process.

However, it will be appreciated that the presence of the shield member on the first surface between the first and second contacts may represent an impediment to the flow of ACA from the contact regions along the first surface of the first circuit module during assembly with a second circuit module.

To address the bending/distortion problem illustrated in FIG. 2 and address the damage (by conductive particles) problem illustrated in FIGS. 3 and 4, the arrangement shown in FIG. 6 may be employed. Here, a plurality of shields (shield members, or shield sections) have been included in the contact layer of the FlexIC (i.e. they have been provided on the first surface) to bond to antenna windings in the application circuit. This provides a 'stand-off' distance between the polymer surface of the FlexIC and the application circuit and improves the planarity of the FlexIC. In other words, each shield section provides both mechanical support to the flexible circuit module and protection, from damage by conductive particles, to a portion of the embedded integrated circuit directly above it.

However, such shield sections may contribute to the impediment of ACA flow along the interface between the FlexIC and application circuit, especially from the contact regions to the central portion, and vice versa.

A further issue is that of minimising the volume and cost of ACA required to attach circuit modules together (e.g. FlexICs to application circuits), whether or not the circuits feature raised 'blocking' features between the contact pads. In general, an excess of ACA is deposited to ensure full coverage of the interface between the two modules (e.g. a FlexIC and an application circuit), which usually leads to 'overspill' of ACA beyond the edges of the FlexIC or other first module. ACA is a relatively high cost material due in significant part to the conductive particles it contains, with higher particle concentrations—forming bonds of higher electrical conductivity—being reflected in higher prices.

It is therefore an aim of certain embodiments of the present invention to address one or more of the problems associated with the prior art.

SUMMARY OF THE INVENTION

An aspect of the present invention is a method of manufacturing an electronic circuit assembly comprising a first electronic circuit module, comprising a first surface and a first electrical contact provided on said first surface, and a second electronic circuit module, comprising a second surface and a second electrical contact provided on said second surface, the method comprising:

arranging the first and second surfaces to face each other, aligned such that said first electrical contact opposes the second electrical contact;

providing a quantity of ACA, comprising a plurality of conductive particles (a first component) and a non-conductive adhesive (a second component), between the first and second surfaces; and urging the first surface and second surface together to distribute at least a portion of the quantity of ACA over a region of the first surface and a region of the second surface such that said quantity occupies a volume between the first and second surfaces, characterised in that the method further comprises providing at least one member on at least one of said surfaces and protruding from one of said surfaces, said at least one member being arranged to control flow of at least one of said components as said portion is distributed.

Another aspect provides an electronic circuit assembly manufactured according to the above aspect, and a further aspects provides an electronic circuit module comprising an electrical contact and at least one member, each provided on the surface and each member protruding from the surface, such that the circuit module is suitable for use in a method or assembly in accordance with the above-mentioned aspects.

Further aspects and embodiments of the present invention are set out in the numbered clauses at the end of the description, and in the claims.

BRIEF DESCRIPTION OF THE DRAWINGS

Embodiments of the present invention will now be described with reference to the accompanying drawings, of which.

DETAILED DESCRIPTION OF EMBODIMENTS

In certain embodiments of a first aspect of the invention, the problem of ACA flow impediment may be reduced by creating slots (i.e. channels) in the shield sections or application circuit conductors, or indeed in any other features or members protruding from the surface of either circuit module that would otherwise represent a greater impediment to flow. A slot or channel may completely interrupt the relevant member, in other words it may extend through the full thickness of the member, or it may have a depth equal to a partial thickness of the member. These slots allow ACA to flow across those features without significantly adversely affecting the stand-off or conduction functionality, respectively. Similar slotted shield sections may additionally or alternatively be created to control the flow of ACA over the interface between the FlexIC and application circuit, whether or not there are 'blocking' application circuit features. Such control may reduce the quantity of ACA required to bond a FlexIC to an application circuit, and/or reduce the cost of the ACA, whilst reducing the risk of puncture by conductive particles by controlling their flow separately from that of the bulk adhesive.

Figure 1:
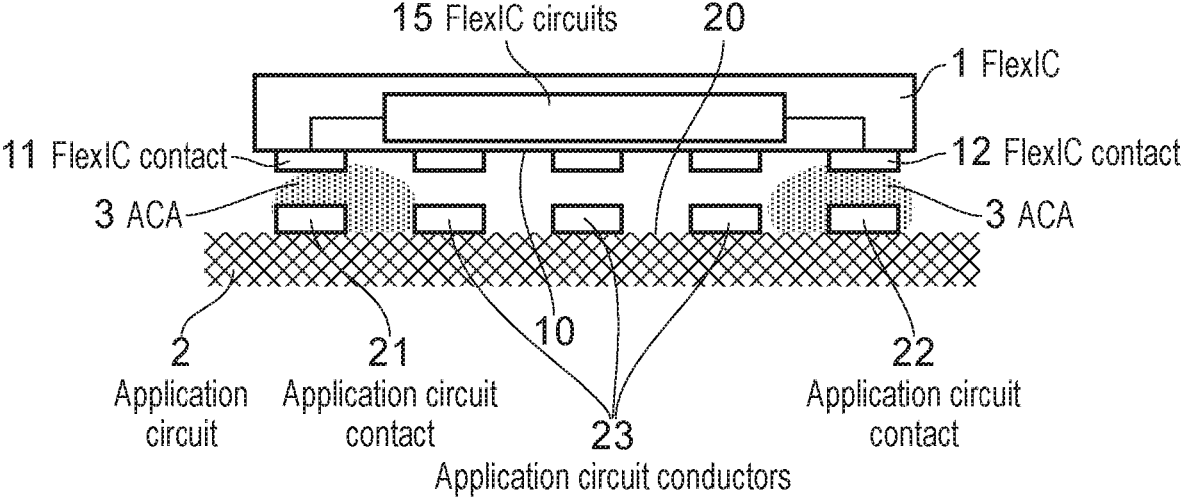
FIGS. 1 to 6 illustrate problems associated with the formation of electronic circuit assemblies comprising first and second circuit modules bonded together using ACA.
Figure 2:
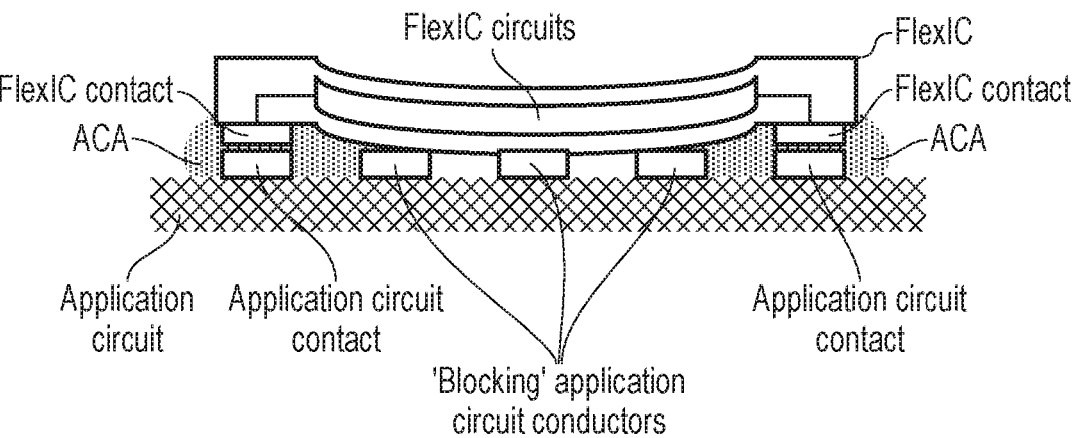
Figure 3:
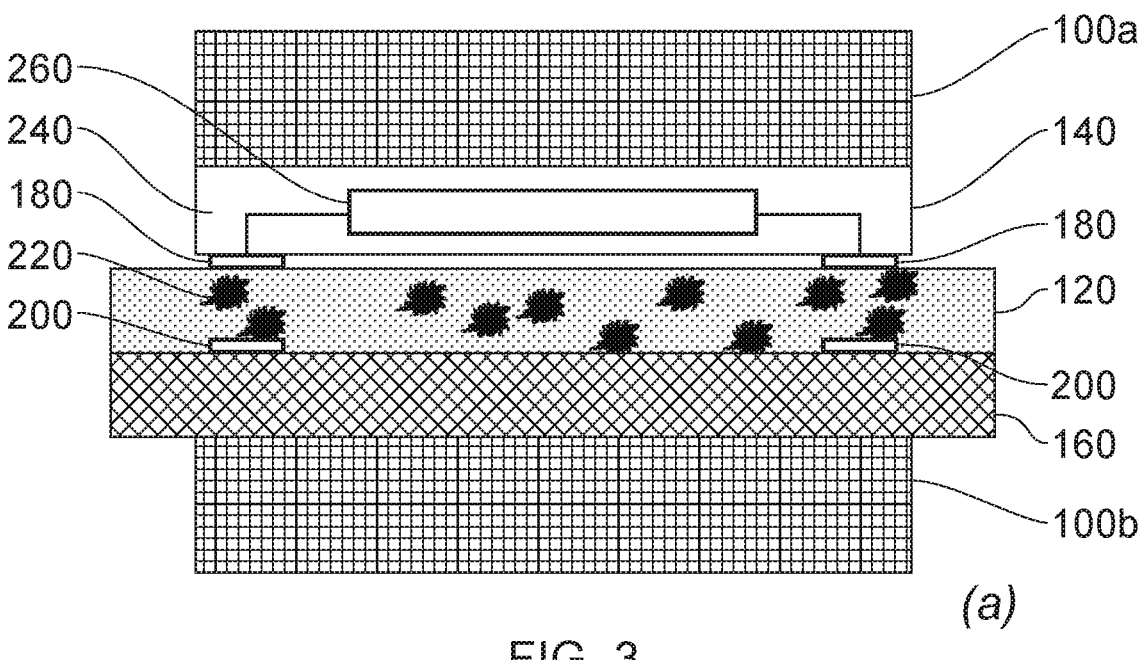
Figure 4:
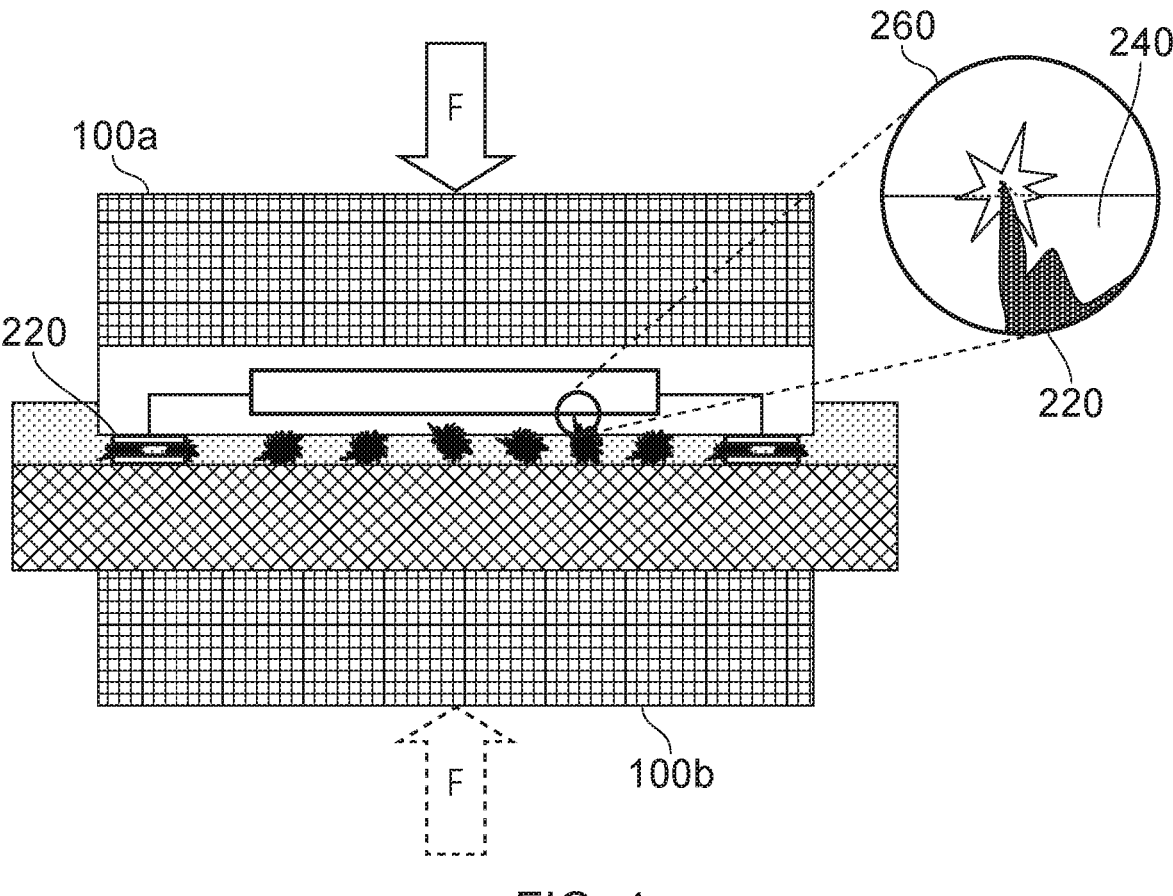
Figure 5:
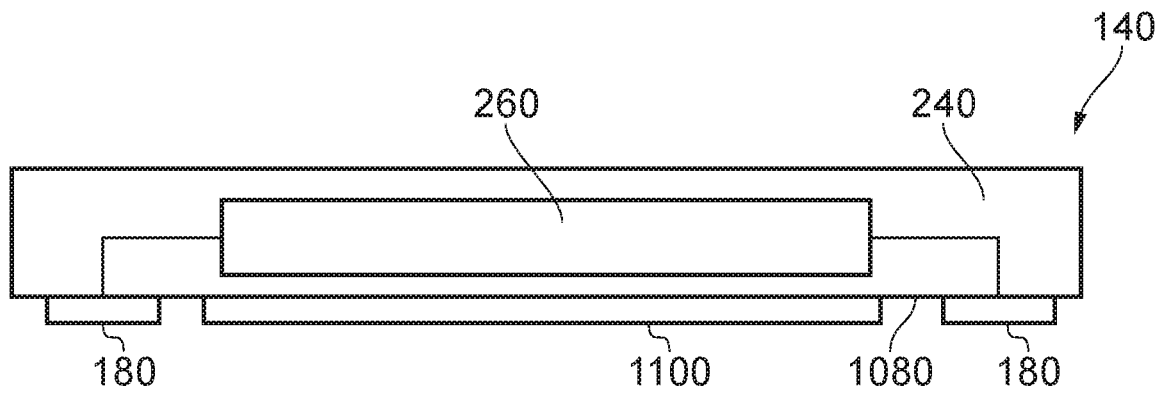
Figure 6:
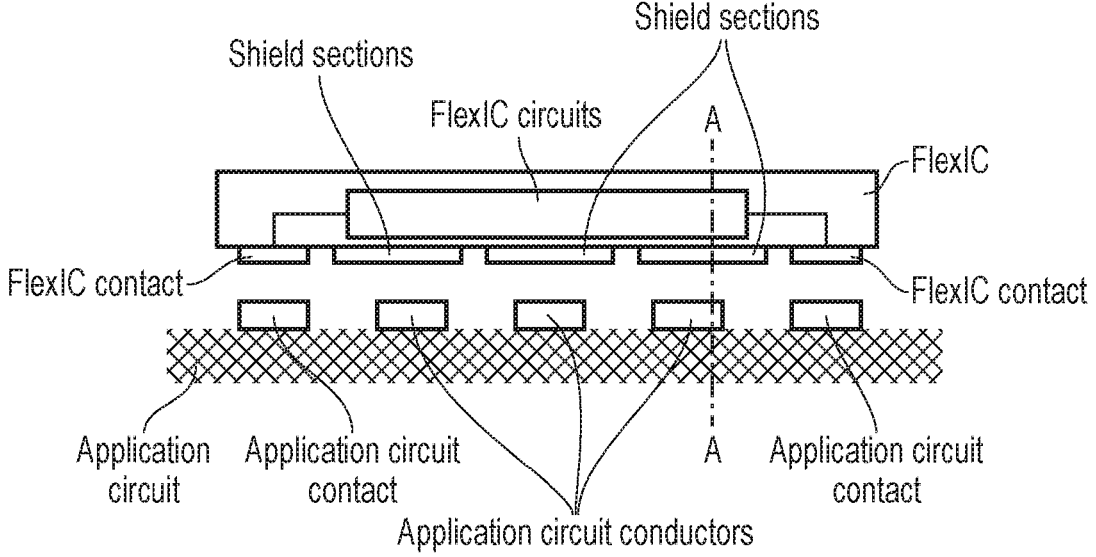
Figure 7:
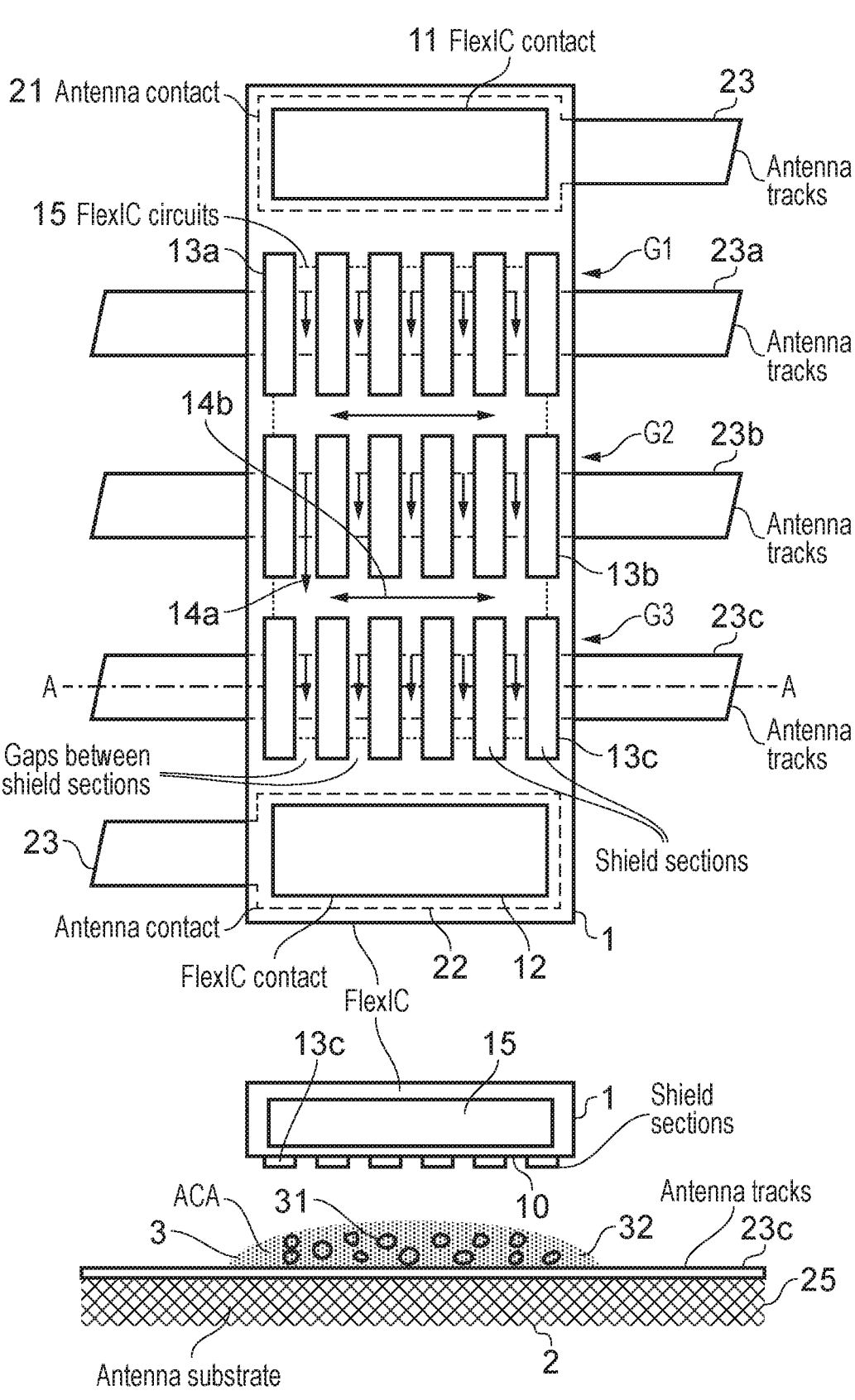
FIG. 7 illustrates components of an assembly embodying an aspect of the invention.

Referring now to FIG. 7, in this illustration of an embodiment, the second circuit module 2 is an application circuit in the form of a conventional HF antenna, with raised conductor tracks 23 on a flexible substrate 25. However the approach illustrated is widely applicable to any application circuit with physical barriers to ACA flow. Shield sections 13 are provided on the FlexIC 1 to bond to the antenna tracks 23, providing stand-off and planarisation functions. However, each shield section includes one or more gaps 14 through which ACA may flow, as illustrated in the upper part of the figure (plan view) and in the lower part of the figure, which shows a cross-sectional view through plane AA.

Thus, in this example the first circuit module 1 is the flexible integrated circuit module having a first surface 10 on which are provided the first and second contacts 11, 12 of the first pair. Also on the first surface there is provided a plurality of members 13 each protruding from the first surface, and arranged in a plurality of rows and a plurality of columns. This arrangement of members can also be regarded as comprising three groups of members. The first group G1 of members 13a is arranged to contact a first antenna track (first further member 23a) of the second module 2, the second group G2 is arranged to contact a second track (second further member 23b), and a third group G3 is arranged to contact a third antenna track (third further member 23c). The first pair of contacts 11, 12 of the flexible circuit module 1 are aligned with the second pair of contacts 21, 22 of the second circuit module 2, that is with the pair of antenna contacts. Within each group of members, adjacent pairs of members are separated by a respective channel 14, which provides a longitudinal flow channel 14a for ACA in a direction generally between the first pair of contacts, from the first electrical contact 11 of the first module towards the second electrical contact 12 of the first module or vice versa. The groups of members are spaced apart from one another in the longitudinal direction (running between the first pair of contacts) and this provides transverse flow channels 14b between adjacent groups. It will be appreciated that the members 13 of the flexible circuit module 1 can be formed from conductive material and may each make electrical contact to the respective underlying antenna track 23 by means of conductive particles 31 in the ACA 3, because the three groups of members G1, G2, G3 are separated from one another in the longitudinal direction and the members are dimensioned and positioned such that none provides an electrical short or bridge between adjacent antenna tracks.

It will be appreciated that in the embodiment of FIG. 7, a plurality of longitudinal flow channels 14a are provided only by the first circuit module 1 (each defined between a respective pair of members 13 protruding from the first surface 10) and no longitudinal flow channels are provided through the antenna tracks (i.e. through the further members 23 provided on the second surface 20 of the second circuit module 2). However, it will be appreciated that in alternative embodiments, longitudinal flow channels 24a may additionally be provided by the second circuit module 2, for example in the form of surface channels or grooves, each crossing a respective one of the antenna tracks. Furthermore, longitudinal flow channels may be provided in the second circuit module which completely interrupt one or more of the antenna tracks, but these electrical breaks in the antenna tracks may then be bridged by connection to one or more members of the first circuit module 1, as will be described below. Thus, in general, longitudinal flow channels 14a, 24a may be provided by either one, or both, of the first and second electronic circuit modules to assist distribution of ACA over the interface between the modules during manufacture of the assembly.

Figure 8:
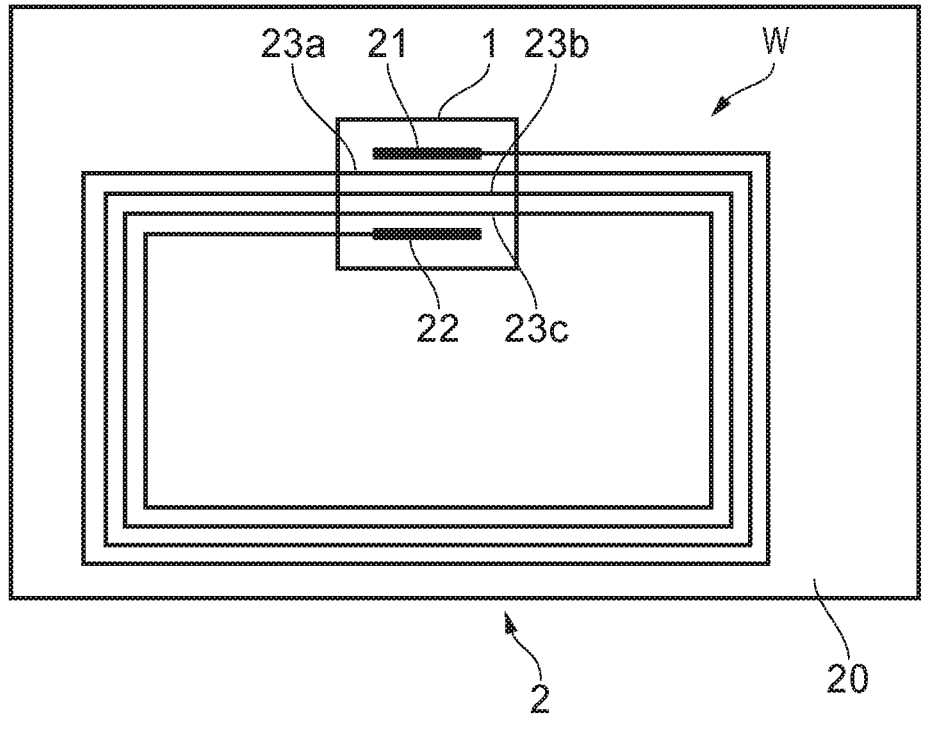
FIG. 8 illustrates components of an embodiment of one aspect of the invention.

Referring now to FIG. 8 this illustrates the antenna winding W of the embodiment of FIG. 7 as a whole, and the position of the first circuit module 1 (the flexIC) relative to the winding W. As can be seen, the first circuit module 1 is positioned over a portion of the antenna which includes the antenna contacts 21, 22 and sections 23a, 23b, and 23c of the antenna winding. The antenna winding W in this example comprises four full turns. The sections are sections of adjacent turns. The winding is formed from conductive material and protrudes from the surface 20 of the second circuit module 2. It may be formed by a variety of techniques, such as by initially providing a layer of conductive material and then patterning that conductive material by a subtractive technique, or by an additive technique.

It will be appreciated that the approach illustrated in FIG. 7 allows a small number of ACA applications to be used, each of low volume, in the manufacture of the assembly, whilst providing full coverage of the interface between the first and second modules (FlexIC and antenna) when pressed together. For example two spots of ACA, one placed on each antenna contact, may spread along the length of the FlexIC via the gaps between shield sections (members). Alternatively a single spot of ACA placed on the central antenna track (central further member) may spread along the FlexIC in both directions, i.e. towards—and covering—both antenna contacts.

Figure 9:
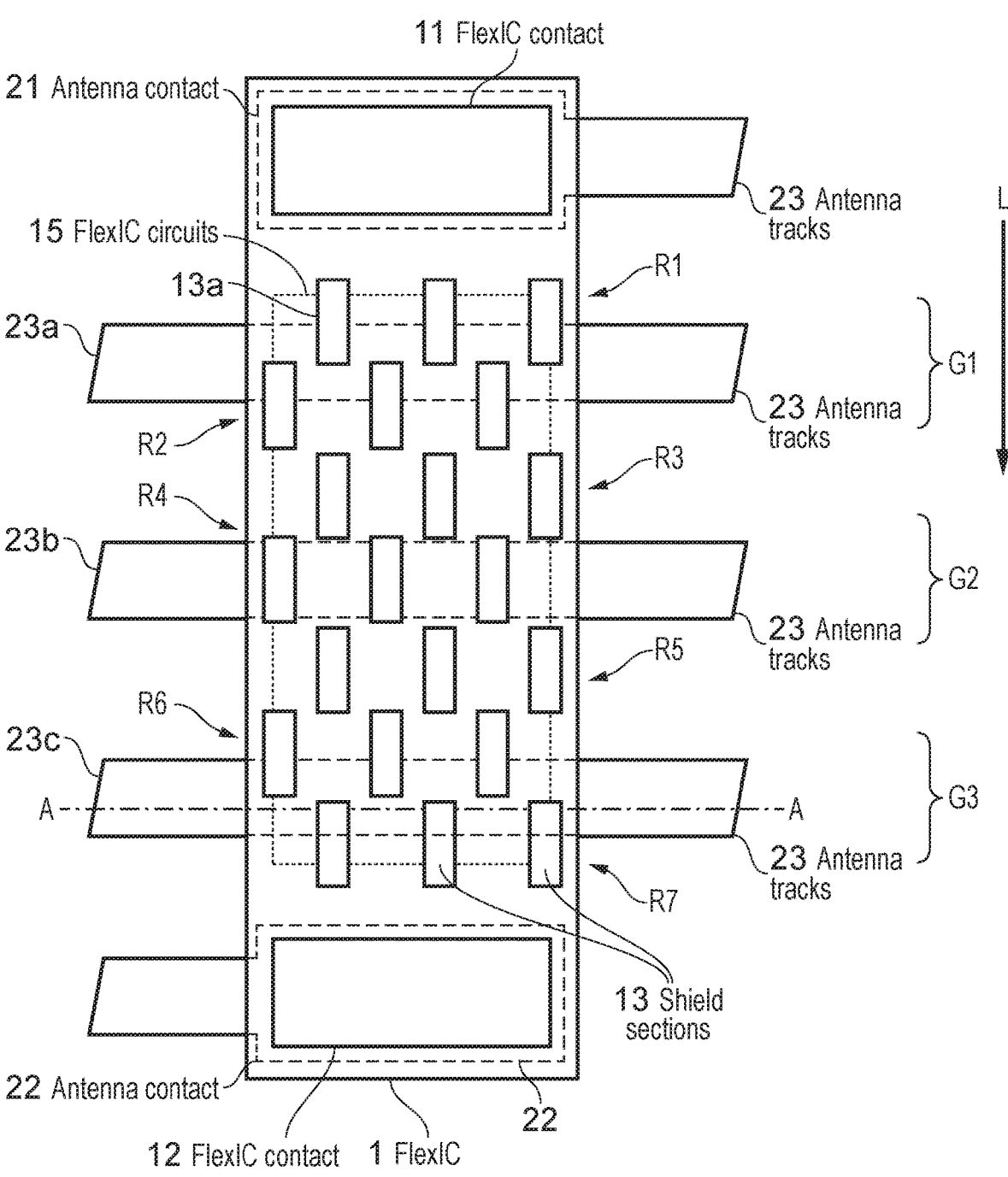
FIG. 9 illustrates components of another assembly embodying an aspect of the invention.

In other embodiments the members (e.g. shield sections) may be less specifically aligned with the further members (e.g. raised conductors) of the second circuit module (e.g. application circuit). For example a pattern of appropriately proportioned shield sections may be non-critically positioned whilst ensuring that they do not form a conductive bridge between two antenna tracks, as illustrated in FIG. 9. In this example the second circuit module 2 comprises a second pair of contacts in the form of first and second antenna contacts 21, 22, and a plurality of further members 23 provided on and protruding from the second surface 20, each further member being provided by a respective track of the antenna. In other words, each further member is a respective turn of the windings of the antenna. The first circuit module 1 comprises a first pair of electrical contacts 11, 12, aligned with the antenna contacts, and a plurality of members 13 each protruding from the first surface 10 of the first module. Although the pattern of members 13 is such that initial positioning of the first circuit module over the antenna contacts and tracks is not critical (in general, as long as the contacts of the first module are generally aligned with the contacts of the second module then the members 13 provide contact with the underlying antenna tracts and provide mechanical support or stiffening support to the first module without forming any short circuit between adjacent antenna tracks), once positioned the members can be regarded as being divided into a plurality of groups G1, G2, G3, each group corresponding to a respective one of the underlying antenna tracks. Each group of members comprises a plurality of rows (G1 comprising rows R1 and R2 for example, G2 comprising R3, R4, R5, G3 comprising R6 and R7), each row extending in a generally transverse direction across the first circuit module at 90 degrees to the longitudinal axis L of the first module which generally runs from the first contact 11 to the second contact 12 of the first pair. Some rows, for example R1, R2, R4, R6 and R7, at least partially overlie one further member 23, whilst other rows, for example R3 and R5, do not directly overlie any of the further members 23. In this example adjacent rows of each group of members are staggered or offset from one another by a distance equal to the length of each member in the longitudinal direction. Members of adjacent rows of each group are also offset from one another in the transverse direction by a distance equal to half the repetition interval of the members in a single row in the transverse direction. The length of each member (i.e. in the longitudinal direction, between the first pair of contacts) is smaller than the separation distance between adjacent further members 23 (antenna tracks) in the second module, and thus no member 13 is able to provide an electrical bridge or short circuit between adjacent antenna tracks. Furthermore, it will be appreciated that each of the members 13 may be formed from conductive material and make electrical contact to an underlying antenna track 23 by means of conductive particles in the ACA without adversely affecting the functioning of the antenna. This is achieved by means of the staggered arrangement of members, and the positioning of that staggered arrangement over the underlying array of antenna tracks is not critical. As long as the electrical contacts of the first module are aligned so as to at least partially overlap the antenna contacts, the array of members is able to provide mechanical support to the first circuit module against bending or distortion and provide flow channels to assist flow of ACA along the interface between the first and second surfaces during manufacture. In other words, the specific pattern of shield sections 13 in FIG. 9 is just one example of a pattern that does not have to align accurately with the antenna, or other arrangement of further members 23 on the second circuit module. The description of the pattern comprising 'groups' and 'rows' once positioned can be regarded as being somewhat arbitrary, as the general concept underlying this aspect is that one does not need to align any particular group of members 13 with any one particular further member 23—the pattern just supports the first module (e.g. FlexIC) on whatever is beneath it, and is structured to avoid shorts. Depending on placement accuracy the shield members 13 that make contact with a given antenna track 23 may differ among a sample of assembled tags. Thus, in alternative embodiments different patterns of members 13 may be employed to achieve the same effects (non-critical placement, yet supporting the first circuit module and not shorting between underlying further members). Additionally, in alternative embodiments the members 13 may have different shapes from that illustrated in FIG. 9. For example, the members 13 may be circular, oval, square, rectangular, polygonal, linear etc.

Figure 10:
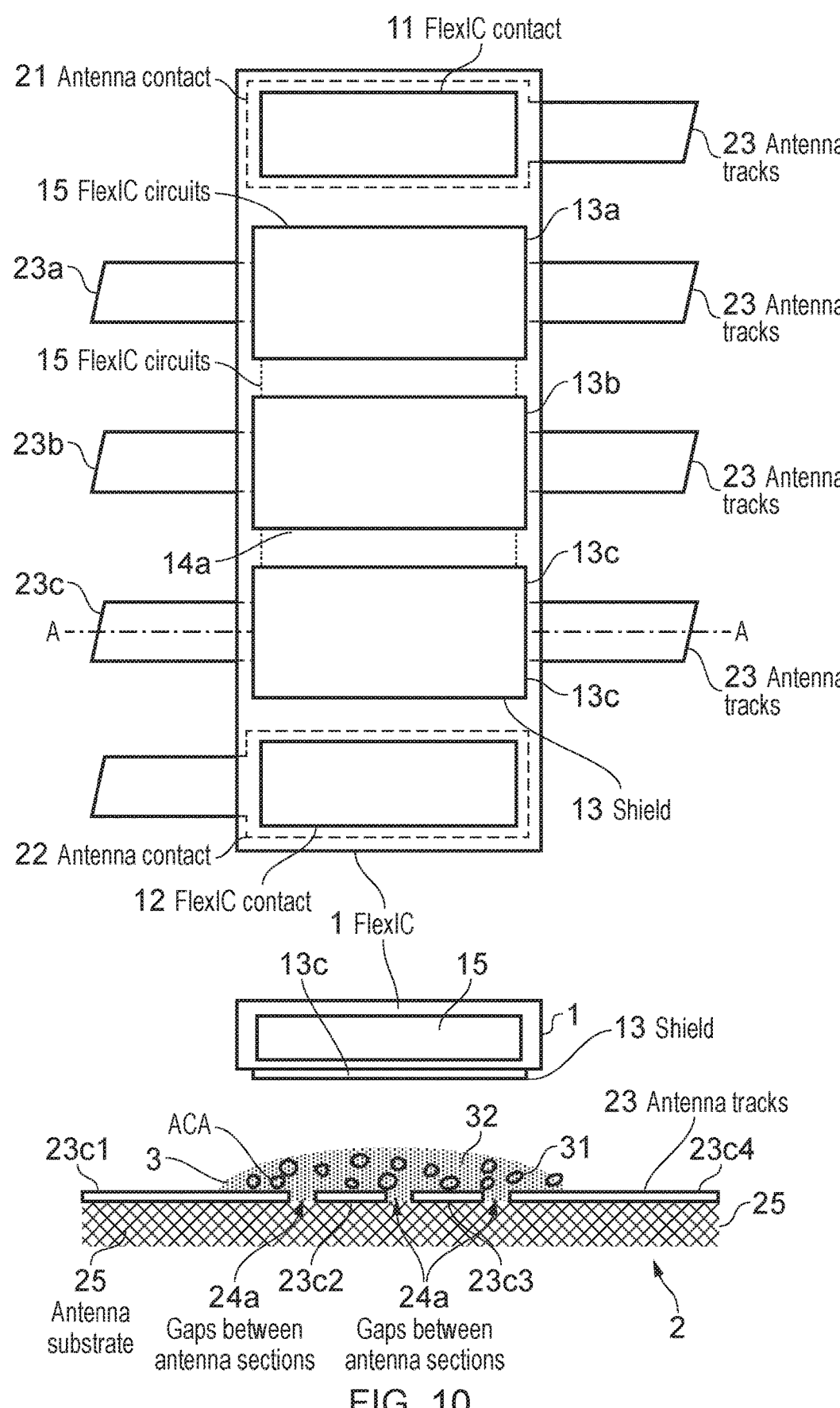
FIG. 10 illustrates components of another embodiment.

In an alternative to the above examples, or to be combined with the above examples to provide additional flow channels, the second circuit module 2 (e.g. application circuit) may be adapted to provide enhanced ACA flow along the interface with the first circuit module (e.g. FlexIC). In this approach it may be necessary to provide a conductive contact between sections of the further members (e.g. application circuit conductors), depending on the function of those further members. Taking the HF antenna again as an illustration, and referring to FIG. 10, in this example the further members 23 are again antenna tracks provided on the second surface 20 of the second circuit module 2. The first circuit module 1 comprises a plurality of members 13, each extending transversely across the first circuit module and having no longitudinal channels formed therein. Each said member 13 is arranged to overlie and make electrical contact with a respective one of the antenna tracks 23 of the second module. Each member is formed of electrically conductive material. To assist flow of ACA during manufacture, each further member (antenna track 23) is provided with a plurality of longitudinal slots 24a running through it. Each slot or channel 24a completely interrupts the respective antenna track 23 and so electrically separates a portion of the antenna track on one side of the slot or channel from a portion on the opposite side. This embodiment thus features slotted application conductors. However, each member 13 in the first circuit module spans the plurality of slots or tracks in its underlying antenna track 23 and forms an electrical connection to each of the otherwise electrically separate portions of the divided antenna track by means of electrically conductive particles 31 of the ACA 3 after manufacture. Thus, the slots or channels interrupting each antenna track provide flow channels to aid distribution of ACA over the interface between the circuit modules during manufacture of the assembly, and the conductive members of the first circuit module provide an electrical connection or bridge between the plurality of sections of the antenna tracks (into which the antenna tracks are cut by the slots or channels) and so enable the antenna to function in its normal manner (unaffected by the slots) in the assembly as a whole. Although in this example no longitudinal slots or channels are provided in the members of the first electronic module, in alternative examples the members may be provided with longitudinal slots or channels, which may extend through the full thickness of the respective members or be surface channels having a depth equal to a partial thickness of the member, provided that if the members are divided completely by longitudinal channels then they must be arranged so as to still provide electrical bridges across each of the slots provided in the underlying antenna tracks. The principles illustrated with reference to FIG. 10 may also be combined with the principles illustrated with reference to FIG. 9 to employ a pattern of members, e.g. shield members, that is still able to provide mechanical support and provide an electrical bridge across each of the plurality of slots in the antenna tracks, without providing short circuits between adjacent antenna tracks in the winding and yet still be less sensitive to alignment with the underlying antenna structure. The lower part of FIG. 10 is a cross section through the assembly along line A-A indicated in the upper part of FIG. 10. As can be seen, one of the antenna tracks 23c is divided, by the three longitudinal slots 24a, into separate sections 23c1, 23c2, 23c3, and 23c4. One of the members 13c is positioned over the slotted antenna track 23c and spans the three slots 24a so that when the first and second circuit modules are urged together the conductive particles 31 of the ACA form electrical connections between each of the antenna track sections and the bridging member 13c.

Figure 11:
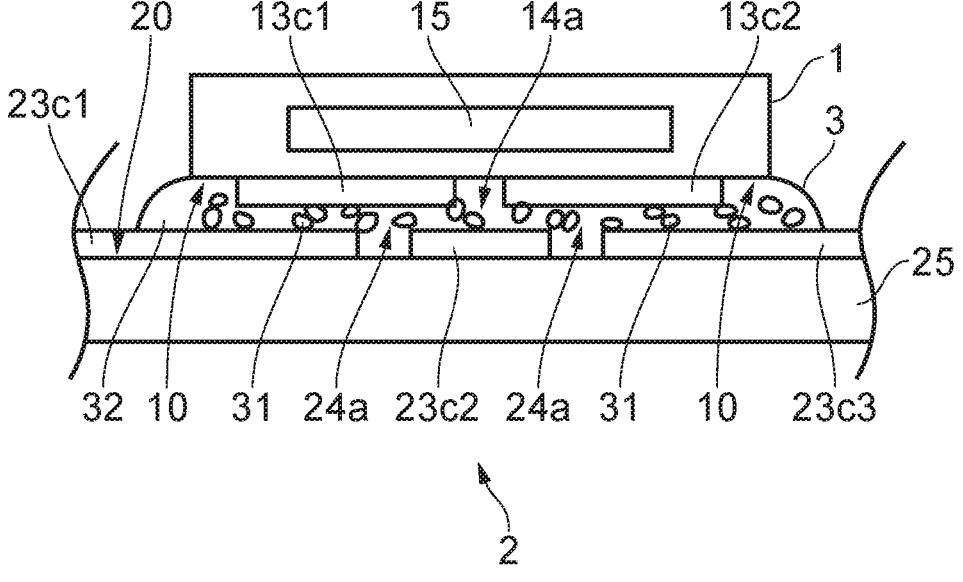
FIG. 11 illustrates more detail of the embodiment similar to that of FIG. 10.

Referring now to FIG. 11, this shows in more detail how a conductive member 13 of the first circuit module 1 is able to provide a conductive bridge across or between antenna sections (or other conductive further members 23) of the second module 2 separated by a slot or channel 24, by means of conductive particles 31 of the ACA 3. It will be appreciated that, in general, these conductive particles are initially separated in the ACA binder. Pressing the surfaces 10, 20 together results in conductive particles coming together in the "vertical direction" of the figure, i.e. the direction normal to the first and second surfaces, but not in a direction parallel to those surfaces In this example the second circuit module 2 comprises a substrate 25 having an upper surface 20 on which is formed at least one conductive antenna track 23. The antenna track 23 is divided into three portions or sections 23c1, 23c2, 23c3 by two longitudinal channels 24a, each of which completely interrupts the antenna track by extending down from an upper surface of the track completely through the track to the substrate surface 20. Thus, the channels 24a each form an electrical break or interruption in the track. The first circuit module 1 comprises an integrated circuit 15 embedded in a flexible body having a lower surface 10 on which are provided a plurality of contacts, not shown in the figure, and a plurality of conductive members 13. The plurality of conductive members includes a first conductive member 13c1 arranged over the channel 24a separating the 1st and 2nd portions 23c1 and 23c2 of the antenna track, and a second conductive member 13c2 arranged over the channel 24a separating the 2nd and 3rd portions 23c2, 23c3 of the antenna track. The first module 1 is bonded to the second module 2 by a quantity of ACA 3, the adhesive component 32 of which holds the modules together, and conductive particles 31 which provide vertical electrical connections between the antenna track sections 23 and the conductive members 13. The conductive particles 31 thus provide an electrical connection between the 1st antenna section 23c1 and the first conductive member 13c1, and between the first conductive member and the second antenna section 23c2. Thus, the first member provides an electrical bridge over the first gap between the 1st and 2nd antenna sections. Similarly, conductive particles 31 provide electrical connections between the second antenna section 23c2 and the second member 13c2, and between the second member and 3rd antenna section 23c3, such that the second member provides an electrical bridge over the second gap. A gap between the first and second members provides a longitudinal flow channel 14a, and the gaps between the antenna track sections provide longitudinal channels 24a. Thus, longitudinal flow channels are provided by each of the 1st and 2nd modules 1, 2, and so assist in the flow of at least the adhesive component 32 of the ACA over the interface between the modules during manufacture.

Figure 12:
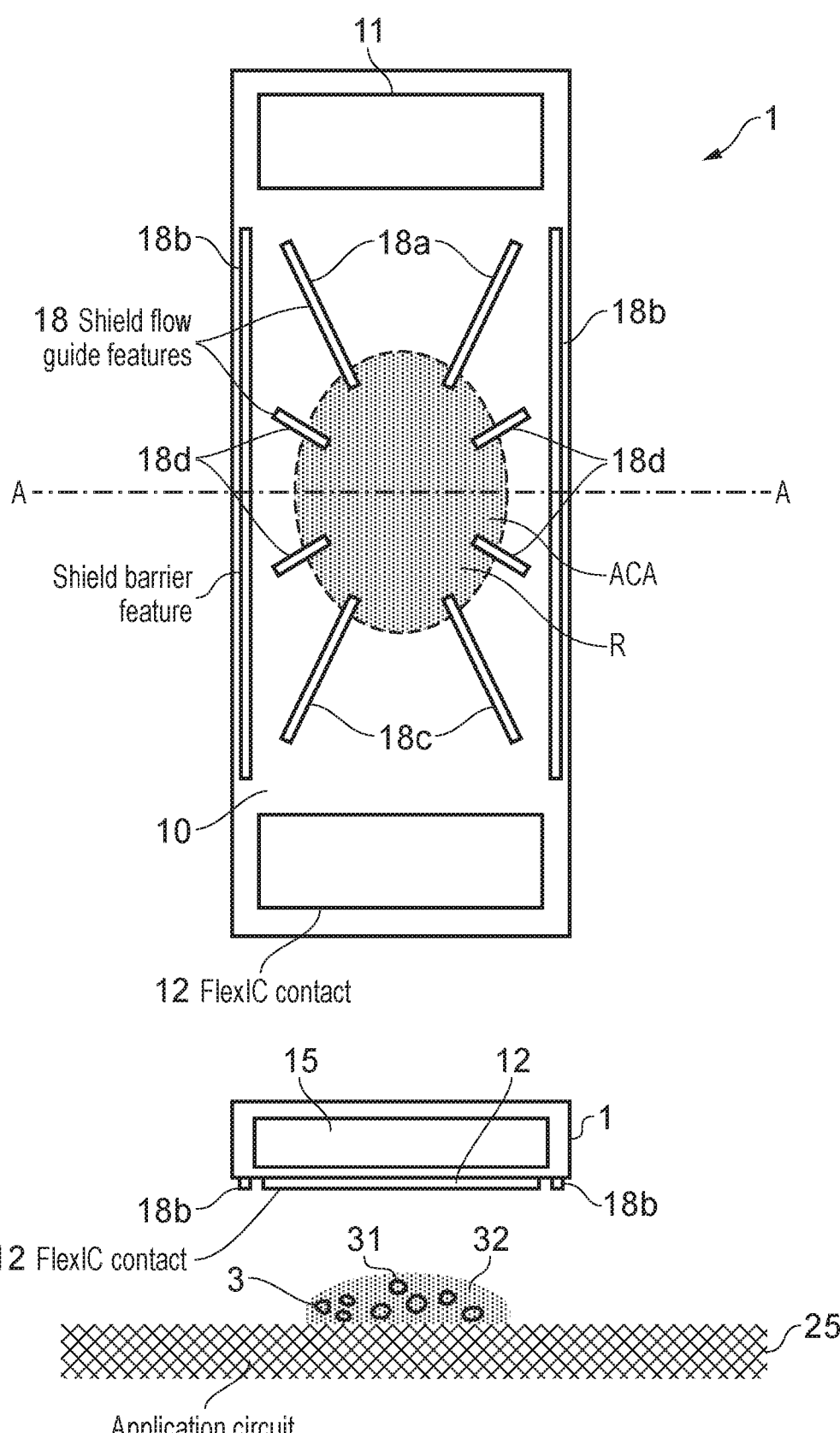
FIG. 12 illustrates components of another assembly embodying an aspect of the invention.

Referring now to FIG. 12, this illustrates an electronic circuit module 1 embodying another aspect of the invention, and its positioning in relation to a second circuit module 2 in the manufacture of another circuit assembly embodying an aspect of the invention. The figure illustrates use of a plurality of guide members 18 to provide ACA directional flow control. In the embodiments described above, channels were provided by one or more of the 1st and 2nd electronic circuit modules to assist flow of ACA over the interface between those circuit modules during manufacture of an assembly. Similar principles may be applied to an electronic circuit module 1 (e.g. FlexIC, incorporating shield and/or support members) design to control the flow of ACA across the interface between the module and an external module (e.g. FlexIC and application circuit), even on a flat external circuit (e.g. application circuit), e.g. with no further members protruding from the second surface, between contacts. For example, flow guides and/or barriers may improve the distribution of ACA from a single application ('spot') on the application circuit, or from a plurality of application spots or regions. This approach may allow minimisation of the quantity of ACA used, and/or the number of ACA dispense operations, and/or the spread of ACA beyond the immediate vicinity of the
      FlexIC, and/or the number of voids (air pockets) in the cured ACA.

For example, the design illustrated in FIG. 12 may direct ACA to the periphery of the FlexIC 1 from its centre, then along the length of the FlexIC towards the ends. This may reduce overspill beyond the boundaries of the FlexIC. The first module 1 comprises a plurality of guide members 18, this plurality of guide members including a first plurality of guide members 18a, 18 c, 18d each arranged to extend generally radially from a portion or region R, for example a central portion, of the first surface to which (or against which) a quantity of the ACA is to be applied either by depositing the quantity of ACA on top of the region, or depositing the quantity of ACA onto a second surface of a second circuit module and then pressing the first surface of the first circuit module down onto the quantity of ACA as illustrated in the lower part of FIG. 12. This first plurality of guide members includes a first pair of guide members 18a which defines a first channel between them, this first channel being arranged to direct a first portion of the quantity of ACA from the central region towards the first electrical contact 11. The first plurality of guide members also includes a second pair of guide members 18c arranged to provide a second channel between them, this second channel being arranged to direct a second quantity of ACA from the central region towards the second electrical contact 12. The plurality of guide members also includes first and second perimeter members 18b arranged on opposite sides of the first surface 10, each arranged to limit ACA from flowing transversely across edges of the first circuit module. In other words, each perimeter member of the guide members is arranged to reduce or stop flow of ACA in at least one direction, and so reduce overspill and enable more efficient use of quantities of ACA during manufacture. It will be appreciated that FIG. 12 is highly schematic, illustrating general principles of flow direction control and flow confinement, that may be applied in alternative embodiments with different patterns/selections of guide members 18. For example, in alternative embodiments, the circuit module 1 may comprise a plurality of radially-patterned areas (i.e. each patterned with respective radial arrangements of guide members) depending on the number of ACA depositions to be applied (i.e. the number of deposition spots or positions) during manufacture of the assembly.

Figure 13:
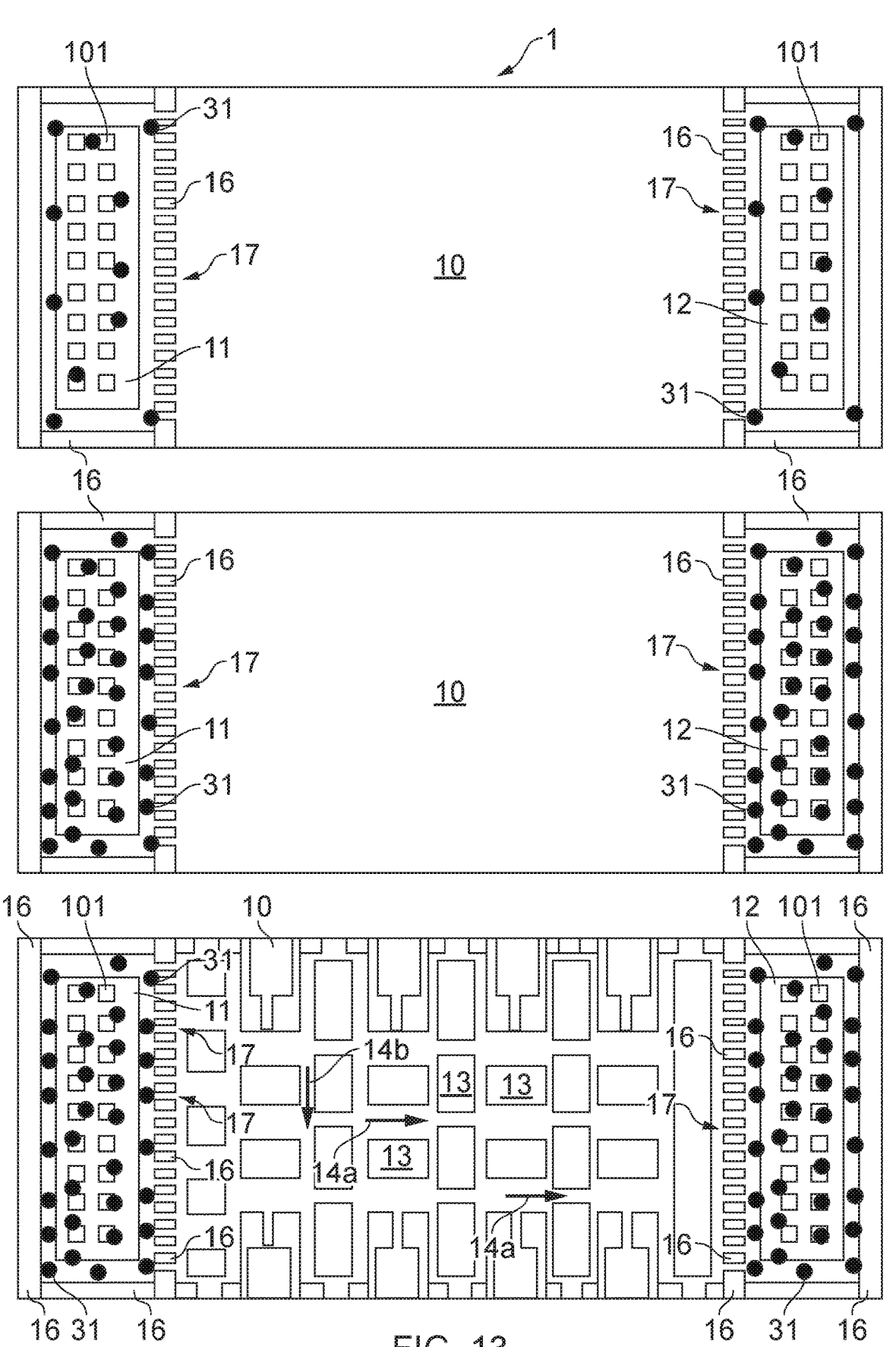
FIG. 13 illustrates electronic circuit modules embodying an aspect of the invention.

Referring now to FIG. 13, this shows electronic circuit modules embodying another aspect of the present invention, and which provide a degree of ACA conductive particle control during manufacture of assemblies incorporating those modules.

As mentioned above, ACA consists of conductive particles 31 suspended in a non-conductive bulk adhesive 32. The arrangement of contact pads and shield sections may enable the flow and distribution of these two ACA fractions to be separately controlled. In general the conductive ACA particles are of the order 3-10 μm in diameter. Shield sections having gaps that are narrower than the conductive particle diameter may behave as traps to the particles but allow the non-conductive adhesive to pass. This may have the effect of filtering the ACA flowing from its point (or points) of deposition.

Several examples of conductive particle flow control are shown in FIG. 13. The bottom portion of FIG. 13 illustrates a circuit module 1 combining particle trapping with the stand-off shield sections described in relation to FIG. 7. The electronic circuit module 1 comprises a plurality of perimeter members 16 provided on and protruding from the first surface 10 and spaced from the first electrical contact 11 and arranged to provide a raised (from the first surface) perimeter barrier around the first electrical contact. The raised perimeter barrier comprises a plurality of channels 17, each defined between a plurality of said perimeter members 16, each channel providing a flow channel arranged to permit, during manufacture of an assembly including the first circuit module, a portion of the non-conductive adhesive of a quantity of ACA deposited inside the raised perimeter barrier to flow out of the raised perimeter barrier. Those channels are, however, dimensioned to inhibit flow of the conductive particles 31 of the ACA out of the perimeter, and so the raised perimeter barrier traps the conductive particles inside it, in the region of the first electrical contact 11. In this example the first electrical contact 11 is provided with a plurality of wells or windows 101, each extending down through the electrical contact to the underlying first surface, so as to provide an additional trap for conductive particles of the ACA. In alternative examples, different forms of particle traps may be employed, such as depressions, slots, channels, or other features in a surface of the first electrical contact. Similarly, the first electrical contact 11 may be provided by a plurality of contact members, separated by channels or slots each of which provides means for inhibiting flow of conductive particles out of the electrical contact region. Also, whilst in this example the channels to permit flow of the non-conductive adhesive component out of the raised perimeter barrier during manufacture are each provided between a respective pair of perimeter members, in alternative embodiments, slots or grooves may be provided in a surface of one or more perimeter members without extending through the full thickness of the perimeter member, to provide alternative or additional flow channels for the non-conductive adhesive component of the ACA. In the arrangement shown in the lowerpart of FIG. 13, the circuit module comprises a second electrical contact 12 surrounded by a second raised perimeter barrier, generally having the same structure and configuration as the first contact and 1st raised perimeter barrier. However, in alternative embodiments, the configurations of the two contacts and the first and second raised perimeter barriers may be different from one another.

In certain methods, ACA is deposited in two spots, one on each contact region of the first module, or of the second module, to which the first module is to be bonded (e.g. on the antenna contact pads). The conductive particles 31 may be confined to the area between the opposing contacts (e.g. between the FlexIC contact pad and the antenna contact pad) when they are pressed together: The non-conductive adhesive flows through the channels 17 (which may also be described as particle traps), out of the raised perimeter barriers and over the interface between the two modules (e.g. FlexIC and antenna), unimpeded by the shield sections (or other members) 13 (which in the left-hand part of FIG. 13 have a plurality of longitudinal 14a and transverse 14b channels running between them), preventing the formation of air pockets. Meanwhile, the conductive particles 31 cannot flow away from the contact pad areas (i.e. inside the raised perimeter barriers) due to the narrow gaps 17 in the particle traps and the solid barrier around the remainder of the pad periphery. This reduces the likelihood of conductive particles causing puncture-induced damage to the circuits in the area of the first circuit module (e.g. FlexIC) lying between the contacts (or contact pads).

The middle portion of FIG. 13 shows a design providing only particle trapping, with the non-conductive adhesive free to flow across the FlexIC between its contact pads without any further control (or any other stand-off structure provision for planarisation).

The upper portion of FIG. 13 illustrates that, because no (or fewer) conductive particles 31 are distributed beyond the area of the contact pads, the conductive particles are effectively concentrated in the volume of ACA connecting the FlexIC contact pads to the antenna contact pads. This allows a lower concentration of conductive particles to be used in the ACA in certain embodiments, reducing its cost.

Figure 14:
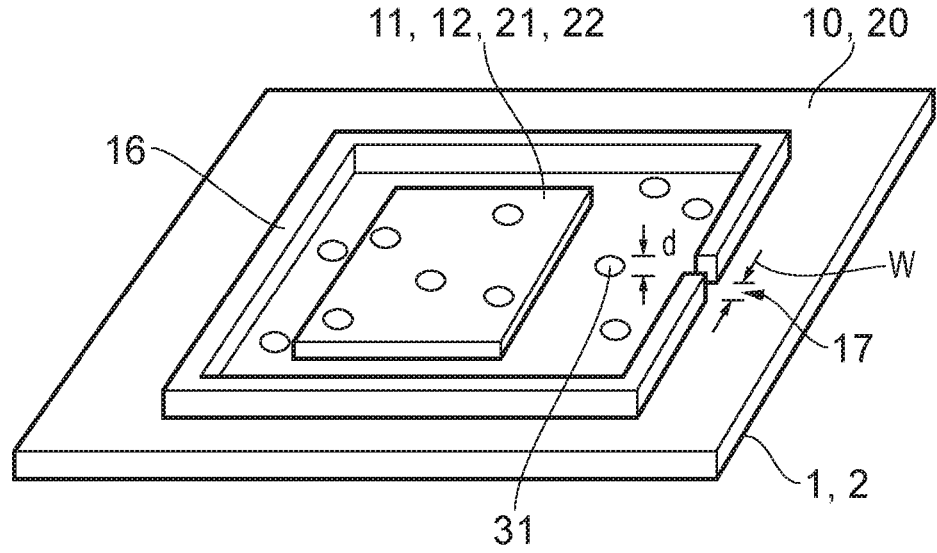
FIG. 14 is a perspective view of part of another circuit module embodying an aspect of the invention.

Referring now to FIG. 14, this shows, in highly schematic form, a contact and raised perimeter barrier structure for use in embodiments of any aspect of the present invention. The contact 11, 12, 21, 22 is formed on a surface 10, 20 of a circuit module 1,2. A perimeter member 16 is also formed on the surface and is spaced from and surrounds the contact. A channel 17 is provided completely through the perimeter member 16, and has a width w. A plurality of conductive particles 31 of an ACA are shown inside the raised perimeter barrier, and have a minimum diameter d, where d is greater than w. Thus, if a quantity of ACA comprising the conductive particles 31 is deposited generally over the contact inside the raised perimeter barrier, then the channel 17 will allow the initially fluid adhesive component 32 of the ACA to flow out of the raised perimeter barrier, away from the contact, but will retain the conductive particles 31 inside the raised perimeter barrier. Although FIG. 14 shows a single flow channel 17, it will be appreciated that alternative embodiments may employ a plurality of flow channels 17. One or more of the channels 17 may extend fully down to the surface 10, 20, and/or one or more of the channels may be a surface channel provided in a surface of a perimeter member and extending only partially down through the perimeter member's thickness. In certain embodiments, the height of the perimeter member 16 above the surface 10, 20 may be the same as the height of the contact 11, 12, 21, 22. In alternative embodiments, however, the perimeter member or members may have a different height from the contact. The perimeter member may have a greater height than the contact member, for example, to provide enhanced trapping of the conductive particles, or may have a lower height than the contact member to enhance general flow of ACA material away from the contact region.

Figure 15:
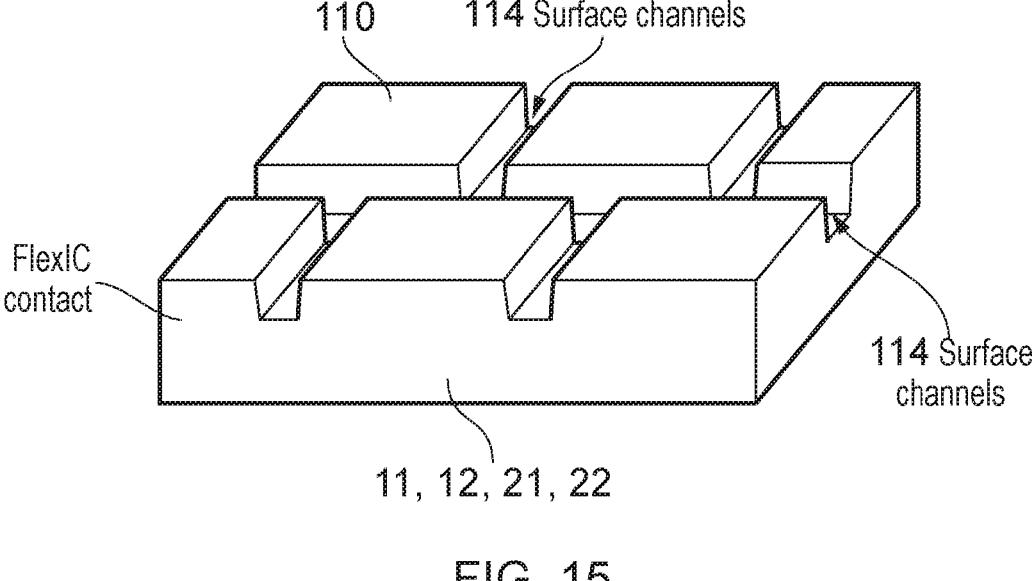
FIG. 15 illustrates the surface structure of an electrical contact suitable for use in embodiments of the invention.
Figure 16:
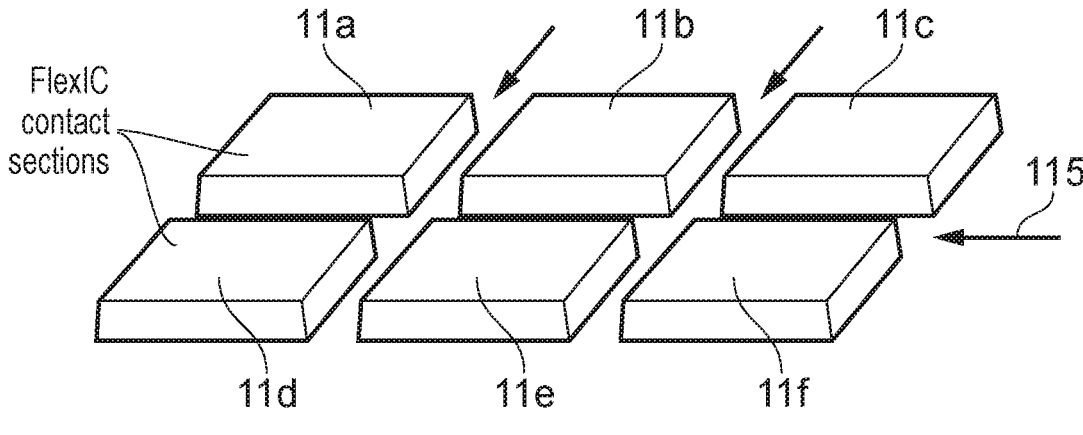
FIG. 16 illustrates another configuration of electrical contact suitable for use in embodiments of the invention.

As illustrated in the above figures, the contact pad areas may be structured, or they may be essentially solid, unbroken and flat (as in FIGS. 7, 9, 10, and 12). Structured contact pads may, however, be used as electrical contacts in certain embodiments of all aspects of the present invention, and in general have surface features that tend to impede the flow of conductive particles in the ACA across the contact pads. FIGS. 15 and 16 illustrate two such structured pads, suitable for use as structured contact pads, FlexIC contact pads, or indeed as structured members and/or structured further members provided on the first or second circuit modules. The surface features, in this case channels 114, in the surface 110 of the contact pad shown in FIG. 15, are narrower than the diameter of the conductive particles in the ACA. However they serve to limit the ability of the particles to move freely over the surface. Such channels may be formed, for example, by defining their width to be narrower than that capable of being fully etched through the thickness of the contact pad in the process of manufacture. In alternative embodiments, the surface channels may be wider, but shallower, and still provide a degree of conductive-particle-trapping functionality. In other examples, such as that shown in FIG. 16, the contact pads may be structured as distinct sections 11*a*-11*d* (with channels 115 between them) that are electrically connected beneath the pad (e.g. with vias in the FlexIC). Such pad sections may increase the flexibility, or reduce a tendency to curl, of the application circuit or the FlexIC.

Figure 17:
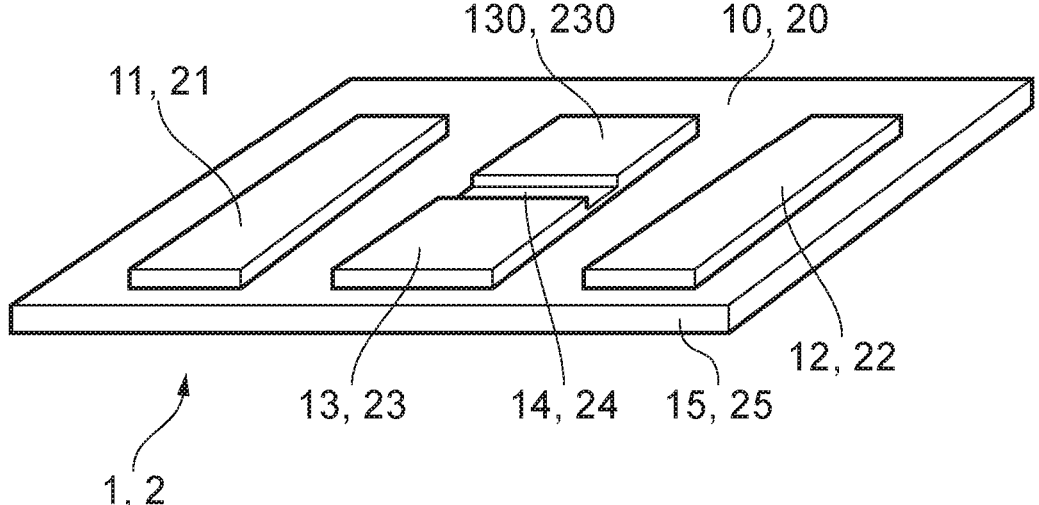
FIG. 17 Illustrates another electronic circuit module embodying an aspect of the invention and suitable for use in assemblies embodying one or more aspects of the invention.

Referring now to FIG. 17, this shows, in highly schematic form, the configuration of another circuit module embodying an aspect of the invention and suitable for use in electronic assemblies embodying other aspects. The circuit module 1, 2 comprises a substrate 15, 25 having a surface 10, 20 on which are formed a first contact 11, 21 and a second contact 12, 22. A member (or further member) 13, 23 is also formed on a region of the surface between the contacts. The member has a surface 130, 230 in which a groove, slot, or channel 14, 24 is formed. That groove has a depth less than the thickness of the member and runs through the member in a generally longitudinal direction, that is a direction from one of the contacts to the other. Although just one surface groove is shown in the figure, it will be appreciated that in alternative embodiments the surface 130, 230 may be provided with a plurality of such grooves, each of which provides a flow channel to assist the flow of at least the non-conductive adhesive component of ACA to flow over the structure during manufacture of an assembly comprising it. Such surface channels maybe combined with channels fully interrupting one or more such members, or defined between members, to improve distribution of ACA adhesive during manufacture of assemblies.

Various aspects and features of techniques disclosed in the present specification are set out in the following numbered clauses. While these are set out separately, it will be understood that the clauses of multiple techniques may be combined. In other words, one or more features of any one technique may be employed in an embodiment of any other technique, with corresponding advantage.

Technique 1: Numbered Clauses

1. An electronic circuit assembly comprising:
   a first electronic circuit module;
   a second electronic circuit module; and a quantity of anisotropic conductive adhesive, ACA, comprising a plurality of electrically conductive particles and an electrically non-conductive adhesive, arranged to bond the first electronic circuit module to the second electronic circuit module,
   wherein the first electronic circuit module comprises a first surface and a first pair of electrical contacts each provided on said first surface, the second electronic circuit module comprises a second surface and a second pair of electrical contacts each provided on said second surface, said first surface is arranged to face said second surface, said first pair of electrical contacts is aligned with said second pair of electrical contacts such that a first electrical contact of the first pair opposes a first electrical contact of the second pair and a second electrical contact of the first pair opposes a second electrical contact of the second pair (In other words, the arrangement is such that there is at least partial overlap between the first contacts of the 1st and 2nd pairs, and between the second contacts of the 1st and 2nd pairs when viewed from a direction generally normal to the plane of the first surface), said quantity of ACA occupies a volume between the first and second surfaces, and conductive particles of the ACA provide a first electrical connection between the first electrical contacts of the first and second pairs, and a second electrical connection between the second electrical contacts of the first and second pairs, and wherein the first electronic circuit module further comprises at least one member provided on and protruding from said first surface and arranged between the first pair of electrical contacts, and at least one channel provided through a said member or defined between a plurality of said members, each said channel providing a flow channel, in a direction parallel to the first surface, for at least said non-conductive adhesive during manufacture of the assembly (for example, as the first surface and second surface are brought/urged together, with the quantity of ACA sandwiched between them).

2. An assembly in accordance with clause 1, wherein at least one said channel provides a flow channel in a direction from the first contact of the first pair to (towards) the second contact of the first pair (in other words, in a direction generally between contacts of the first pair).

3. An assembly in accordance with any preceding clause, wherein at least one said channel is provided by a groove in a surface of one of said members (the depth of the groove being less than the thickness of the member it extends through, such that the groove does not cleave the member).

4. An assembly in accordance with any preceding clause, wherein at least one said channel cleaves one of said members into first and second separated portions.

5. An assembly in accordance with any preceding clause, wherein at least one said channel has a width smaller than an average size of the conductive particles so as to inhibit flow of said conductive particles through it during manufacture of the assembly.

6. An assembly in accordance with any preceding clause, wherein at least one said channel has a width greater than an average size of the conductive particles so as to enable flow of said conductive particles through it during manufacture of the assembly.

7. An assembly in accordance with any preceding clause, wherein each of the first pair of electrical contacts protrudes from said first surface.

8. An assembly in accordance with clause 7, wherein each of the first pair of electrical contacts and each said member protrudes from the first surface by the same distance.

9. An assembly in accordance with any preceding clause, wherein the first electronic circuit module comprises a plurality of said members.

10. An assembly in accordance with clause 9, comprising a plurality of said channels, each of the plurality of channels being defined between at least one respective pair of said plurality of members.

11. An assembly in accordance with clause 10, wherein said plurality of channels comprises a plurality of longitudinal channels, each extending in a direction parallel to a longitudinal direction from the first electrical contact of the first pair to the second electrical contact of the first pair.

12. An assembly in accordance with clause 10 or clause 11, wherein said plurality of channels comprises a plurality of transverse channels each extending in a direction transverse to a longitudinal direction from the first electrical contact of the first pair to the second electrical contact of the first pair.

14. An assembly in accordance with any one of clauses 9 to 12, wherein said plurality of members are arranged in a plurality of rows and a plurality of columns.

15. An assembly in accordance with any one of clauses 9 to 14, wherein said plurality of members are arranged as a rectangular array.

16. An assembly in accordance with any one of clauses 9 to 14, wherein said plurality of members are arranged in a staggered formation.

17. An assembly in accordance with any preceding clause, wherein each said member is at least one of: a conductive member; a shielding member; a spacer member; an insulating member (electrically non-conducting); and an electrical or electronic component of the first electronic circuit module.

18. An assembly in accordance with any preceding clause, wherein the second electronic circuit module further comprises at least one further member provided on and protruding from said second surface and arranged between the second pair of electrical contacts, and at least one further channel provided through a said further member or defined between a plurality of said further members, each said further channel providing a further flow channel, in a direction parallel to the second surface, for at least said non-conductive adhesive during manufacture of the assembly.

19. An assembly in accordance with clause 18, wherein at least one said further channel provides a flow channel in a direction from the first contact of the second pair to (towards) the second contact of the second pair (in other words, in a direction generally between contacts of the second pair).

20. An assembly in accordance with clause 18 or clause 19, wherein at least one said further channel is provided by a groove in a surface of one of said further members (the depth of the groove being less than the thickness of the further member it extends through, such that the groove does not cleave the further member).

21. An assembly in accordance with any one of clauses 18 to 20, wherein at least one said further channel cleaves one of said further members into first and second separated portions.

22. An assembly in accordance with any one of clauses 18 to 21, wherein at least one said further channel has a width smaller than an average size of the conductive particles so as to inhibit flow of said conductive particles through it during manufacture of the assembly.

23. An assembly in accordance with any one of clauses 18 to 22, wherein at least one said further channel has a width greater than an average size of the conductive particles so as to enable flow of said conductive particles through it during manufacture of the assembly.

24. An assembly in accordance with any one of clauses 18 to 23, wherein each of the second pair of electrical contacts protrudes from said second surface.

25. An assembly in accordance with clause 25, wherein each of the second pair of electrical contacts and each said further member protrudes from the second surface by the same distance.

26. An assembly in accordance with any one of clauses 18 to 25, wherein the second electronic circuit module comprises a plurality of said further members.

27. An assembly in accordance with clause 26, comprising a plurality of said further channels, each of the plurality of further channels being defined between at least one respective pair of said plurality of further members.

28. An assembly in accordance with clause 27, wherein said plurality of further channels comprises a plurality of further longitudinal channels, each extending in a direction parallel to a longitudinal direction from the first electrical contact of the second pair to the second electrical contact of the second pair.

29. An assembly in accordance with clause 27 or clause 28, wherein said plurality of further channels comprises a plurality of further transverse channels each extending in a direction transverse to a longitudinal direction from the first electrical contact of the second pair to the second electrical contact of the second pair.

30. An assembly in accordance with any one of clauses 26 to 29, wherein said plurality of further members are arranged in a plurality of rows and a plurality of columns.

31. An assembly in accordance with any one of clauses 18 to 30, wherein each said further member is at least one of: a conductive member; an antenna track; a turn of an antenna winding; a shielding member; a spacer member; an insulating member (electrically non-conducting); and an electrical or electronic component of the second electronic circuit module.

32. An assembly in accordance with any one of clauses 18 to 31, wherein at least one said member is aligned with at least one said further member (e.g. to provide mechanical support to at least one of the 1st and 2nd circuit modules).

33. An assembly in accordance with any one of clauses 18 to 32, wherein the at least one member comprises a first member and the at least one further member comprises a first further member, the first member is aligned with the first further member, and both the first member and first further member are electrically conductive, such that conductive particles of the ACA provide a first further electrical connection between the first member and first further member.

34. An assembly in accordance with clause 33, wherein the at least one further member comprises a second further member, the second further member is electrically conductive and the first member is aligned with the second further member such that conductive particles of the ACA provide a second further electrical connection between the first member and the second further member, and such that the first member provides an electrical connection (electrical bridge) between the first further member and the second further member.

35. An assembly in accordance with clause 34, where in the first further member and second further member are respective portions of an antenna winding or track.

36. An assembly in accordance with clause 34 or clause 35, where in a gap between the first further member and the second further member provides a said further channel (for example, in a direction from the first contact of the second pair toward the second contact of the second pair).

37. An assembly in accordance with any one of clauses 18 to 36, wherein the at least one member comprises a first plurality (or group) of members aligned with a corresponding one further member on the second module.

38. An assembly in accordance with clause 37, wherein a gap between an adjacent pair of members of said first plurality of members provides a said channel (for example, in a direction from the first contact of the first pair toward the second contact of the first pair).

39. An assembly in accordance with any one of clauses 18 to 38, wherein the at least one further member comprises a first plurality of further members, each aligned with a respective group of members of the first module.

40. An assembly in accordance with clause 39, wherein a plurality of gaps, each defined between an adjacent pair of members in a respective group, provide a plurality of said channels.

41. An assembly in accordance with clause 39 or clause 40, wherein the first plurality of further members are turns of an antenna winding (or track).

42. An assembly in accordance with any one of clauses 39 to 41, wherein each said group of members comprises a plurality of members arranged in a row, with gaps between adjacent members providing a plurality of said channels parallel to a longitudinal direction between contacts of the first pair.

43. An assembly in accordance with any one of clauses 39 to 41, wherein each said group of members comprises a plurality of members arranged in at least two staggered rows, each member having a length in a direction parallel to a longitudinal direction between contacts of the first pair, said length being smaller than a minimum separation distance, in the longitudinal direction, between adjacent further members of the first plurality of further members (such that no member can form an electrical bridge between adjacent further members, e.g. between adjacent turns of the antenna winding).

44. An assembly in accordance with any preceding clause, wherein at least one of the first and second electronic circuit modules is flexible.

45. An assembly in accordance with any preceding clause, wherein each of the first and second electronic circuit modules is flexible.

46. An assembly in accordance with any one of clauses 1 to 44, wherein one of the first and second circuit modules is flexible and the other one of the first and second electronic circuit modules is rigid.

47. An assembly in accordance with any preceding clause, wherein at least one of the first and second electronic circuit modules comprises an electronic circuit (e.g. an integrated circuit, IC) coupled to the respective pair of electrical contacts.

48. An assembly in accordance with any preceding clause, wherein the first electronic circuit module is a flexible integrated circuit and the second electronic circuit module is an application circuit.

49. A first electronic circuit module for an assembly in accordance with any preceding clause.

50. A second electronic circuit module for an assembly in accordance with any one of clauses 1 to 48.

51. A method of manufacturing an electronic circuit assembly, the method comprising:
   providing a first electronic circuit module as defined in any one of clauses 1 to 48;
   providing a second electronic circuit module as defined in any one of clauses 1 to 48;
   applying a quantity of ACA to at least one region of the first surface and/or the second surface;
   arranging said first surface to face said second surface, with the first pair of electrical contacts aligned with said second pair of electrical contacts such that the first electrical contact of the first pair opposes the first electrical contact of the second pair and the second electrical contact of the first pair opposes the second electrical contact of the second pair;

urging the first surface and second surface together such that at least the non-conducting adhesive component of the ACA is distributed over the first and second surfaces and flows through at least one said channel and/or further channel such that said quantity of ACA occupies a volume between the first and second surfaces, and conductive particles of the ACA provide a first electrical connection between the first electrical contacts of the first and second pairs, and a second electrical connection between the second electrical contacts of the first and second pairs.

52. A method in accordance with clause 51, wherein said applying comprises applying said quantity of ACA to a plurality of regions of the first surface and/or the second surface.

53. An electronic circuit assembly comprising:

a first electronic circuit module;

a second electronic circuit module; and a quantity of anisotropic conductive adhesive, ACA, comprising a plurality of electrically conductive particles and an electrically non-conductive adhesive, arranged to bond the first electronic circuit module to the second electronic circuit module, wherein the first electronic circuit module comprises a first surface and a first electrical contact provided on said first surface, the second electronic circuit module comprises a second surface and a second electrical contact provided on said second surface, said first surface is arranged to face said second surface, said first electrical contact is aligned with said second electrical contact such that the first electrical contact opposes the second electrical contact, said quantity of ACA occupies a volume between the first and second surfaces, and conductive particles of the ACA provide a first electrical connection between the first electrical contact and the second electrical contact, and wherein the first electronic circuit module further comprises at least one member provided on and protruding from said first surface and spaced from the first electrical contact, and at least one channel provided through a said member or defined between a plurality of said members, each said channel providing a flow channel, in a direction parallel to the first surface, for at least said non-conductive adhesive during manufacture of the assembly (for example, as the first surface and second surface are brought/urged together, with the quantity of ACA sandwiched between them).

54. An assembly in accordance with clause 53, wherein at least one said channel is arranged to provide a flow channel in a direction away from said first electrical contact.

55. An assembly in accordance with clause 53 or clause 54, wherein the second electronic circuit module further comprises at least one further member provided on and protruding from said second surface and spaced from the second electrical contact, and at least one further channel provided through a said further member or defined between a plurality of said further members, each said further channel providing a further flow channel, in a direction parallel to the second surface, for at least said non-conductive adhesive during manufacture of the assembly.

56. An assembly in accordance with clause 55, wherein at least one said further channel provides a flow channel in a direction away from the second contact.

57. An assembly in accordance with clause 55 or clause 56, wherein at least one further member is aligned with at least one member.

58. An assembly in accordance with any one of clauses 53 to 57, further comprising at least one blocking member provided on and protruding from said first surface and arranged to inhibit flow of at least one component of the ACA in a direction away from the first electrical contact during manufacture of the assembly.

Technique 2: Clauses

1. An electronic circuit module, comprising a first surface and a first electrical contact provided on said first surface, for bonding to a second electronic circuit module comprising a second surface and a second electrical contact provided on said second surface to form an electronic circuit assembly by providing a quantity of anisotropic conductive adhesive, ACA, comprising a plurality of electrically conductive particles and an electrically non-conductive adhesive, between the first and second surfaces and urging said surfaces towards each other, with said contacts aligned such that conductive particles form an electrical connection between the first and second contacts, the electronic circuit module further comprising a region of said first surface to or against which said quantity of ACA may be applied, and a plurality of guide members, each provided on and protruding from said first surface, said plurality of guide members being arranged to guide at least a portion of said quantity of ACA from said region in a direction parallel with the first surface during manufacture of the assembly.

2. A module in accordance with clause 1, wherein the plurality of guide members comprises at least one pair of guide members defining a channel between them, said channel being arranged to direct flow of said ACA away from said region (e.g. in a desired or predetermined direction).

3. A module in accordance with clause one or clause 2, wherein the first electrical contact is provided inside said region.

4. a module in accordance with clause one or clause 2, where in the first electrical contact lies partly within said region.

5. A module in accordance with clause 1 or clause 2, where in the first electrical contact is outside said region.

6. A module in accordance with clause 5, wherein the plurality of guide members are arranged to guide at least a portion of said quantity of ACA from said region to (or towards) said first electrical contact.

7. A module in accordance with clause 5 or clause 6, wherein the electronic circuit module further comprises a further electrical contact provided on said first surface, and said region is arranged between the first and further electrical contacts.

8. A module in accordance with clause 7, wherein the plurality of guide members are arranged to guide a first portion of the quantity of ACA from said region to (or towards) said first electrical contact and a second portion of the quantity of ACA from said region to (or towards) said further electrical contact.

9. A module in accordance with any preceding clause, wherein the plurality of guide members further comprises at least one guide member arranged to limit or restrict the extent of flow of at least one component of the ACA over the first surface.

10. A module in accordance with clause 9, wherein the plurality of guide members comprises at least one perimeter member arranged to define a side of a perimeter of an area of the first surface over which flow of the ACA is to be restricted.

11. A module in accordance with any preceding clause, wherein the plurality of guide members comprises a plurality of guide members each arranged to extend radially from said region.

12. A module in accordance with any preceding clause, further comprising a further electrical contact provided on said first surface, wherein the plurality of guide members are arranged to guide at least portions of quantities of ACA applied to or againstthe first and further electrical contacts over a portion of the first surface between the first and further contacts.

13. A module in accordance with any preceding clause, where in the electronic circuit module is flexible.

14. A module in accordance with any preceding clause, wherein the electronic circuit module further comprises an integrated circuit coupled to the first electrical contact.

15. An electronic circuit assembly comprising a first electronic circuit module in accordance with any preceding clause and a second electronic circuit module comprising a second surface and a second electrical contact provided on said second surface, the first and second surfaces being arranged to face each other and being aligned such said first electrical contact opposes the second electrical contact, the assembly further comprising a quantity of ACA, comprising a plurality of conductive particles and a non-conductive adhesive, occupying a volume between the first and second surfaces and conductive particles of the ACA providing an electrical connection between the first electrical contact and the second electrical contact.

16. A method of manufacturing an electronic circuit assembly, the method comprising:
    providing a first electronic circuit module as defined by any one of clauses 1 to 14;
    providing a second electronic circuit module comprising a second surface and a second electrical contact provided on said second surface;
    applying a quantity of ACA to (over) at least said region of the first surface;
    arranging said first surface to face said second surface, with the first electrical contact aligned with the second electrical contact such that the first electrical contact opposes the second electrical contact;
    urging the first surface and second surface together such that the ACA is distributed over the first and second surfaces, guided by the plurality of guide members, and such that said quantity of ACA occupies a volume between the first and second surfaces, and conductive particles of the ACA provide an electrical connection between the first electrical contact and the second electrical contact.

17. A method in accordance with clause 16, wherein said applying comprises applying said quantity of ACA to a plurality of regions of the first surface.

18. A method in accordance with clause 17, where in the first electronic circuit module comprises a further electrical contact and said applying comprises applying said quantity of ACA to at least the first electrical contact and the further electrical contact.

19. A method in accordance with clause 18, further comprising applying a portion of the quantity of ACA to a region of the first surface between the first and further contacts.

Technique 3: Clauses

1. An electronic circuit module comprising a first surface and a first electrical contact provided on said first surface, for bonding to a second electronic circuit module comprising a second surface and a second electrical contact provided on said second surface to form an electronic circuit assembly by providing a quantity of anisotropic conductive adhesive, ACA, comprising a plurality of electrically conductive particles and an electrically non-conductive adhesive, between the first and second surfaces and urging said surfaces towards each other, with said contacts aligned such that conductive particles form an electrical connection between the first and second contacts,
    the electronic circuit module further comprising at least one perimeter member provided on and protruding from said first surface and spaced from the first electrical contact and arranged to provide a raised (from the first surface) perimeter barrier around the first electrical contact, said raised perimeter barrier comprising at least one channel provided through a said perimeter member or defined between a plurality of said perimeter members, each said channel providing a flow channel arranged to permit, during manufacture of the assembly, a portion of the non-conductive adhesive of a quantity of ACA deposited inside the raised perimeter barrier to flow out of the raised perimeter barrier.

2. A module in accordance with clause 1, wherein each said channel has a width not exceeding X, such that each channel is arranged to inhibit (or prevent) flow through it, during manufacture of the assembly, of conductive particles of said quantity of ACA having a minimum dimension greater than X out of the raised perimeter barrier.

3. A module in accordance with clause 1 or clause 2, wherein the first electrical contact protrudes from said first surface.

4. A module in accordance with clause 3, wherein the first electrical contact and each perimeter member protrudes from the first surface by the same distance.

5. A module in accordance with any preceding clause, wherein at least one groove or surface channel is provided in a surface of the first electrical contact.

6. A module in accordance with any preceding clause, wherein a surface of the first electrical contact is provided with at least one groove, surface channel, depression, hollow, or window down to the first surface, for trapping conductive particles of the ACA.

7. A module in accordance with any preceding clause, wherein the first electrical contact comprises a plurality of first electrical contact members, each arranged inside the raised perimeter barrier.

8. A module in accordance with clause 7, wherein the plurality of first electrical contact members are arranged in a plurality of rows and a plurality of columns.

9. A module in accordance with any preceding clause, wherein the at least one perimeter member comprises a first perimeter member having a surface (e.g. upper surface) in which a plurality of surface channels are provided, each surface channel having a depth smaller than a thickness of the first perimeter member and being arranged to permit flow of the non-conductive adhesive through it, during manufacture of the assembly, from one side of the first perimeter member to an opposite side of the first perimeter member.

10. A module in accordance with clause 9, as depending from clause 2, wherein each surface channel has a width not exceeding X.

11. A module in accordance with clause 9 or clause 10, wherein the first perimeter member encloses the first contact.

12. A module in accordance with any one of clauses 1 to 10, wherein the at least one perimeter member comprises a plurality of perimeter members, and said at least one channel comprises a plurality of channels, each channel of said plurality of channels being provided between a respective pair of the plurality of perimeter members.

13. A module in accordance with any preceding clause, further comprising a further electrical contact provided on said first surface, wherein said at least one channel comprises at least one channel arranged to permit, during manufacture of the assembly, a portion of the non-conductive adhesive of a quantity of ACA deposited inside the raised perimeter barrier to flow out of the raised perimeter barrier in a direction towards the further electrical contact.

14. A module in accordance with clause 13, further comprising at least one further perimeter member provided on and protruding from said first surface and spaced from the further electrical contact and arranged to provide a second raised (from the first surface) perimeter barrier around the further electrical contact, said second raised perimeter barrier comprising at least one further channel provided through a said further perimeter member or defined between a plurality of said further perimeter members, each said further channel providing a flow channel arranged to permit, during manufacture of the assembly, a portion of the non-conductive adhesive of a quantity of ACA deposited inside the second raised perimeter barrier to flow out of the second raised perimeter barrier.

15. A module in accordance with Clause 13 or clause 14, further comprising at least one additional member, each additional member protruding from the first surface and being provided on said first surface in a region of the first surface between the first and further contacts.

16. A module in accordance with clause 15, further comprising at least one additional channel provided through a said additional member or defined between a plurality of said additional members, each said additional channel providing a flow channel arranged to permit, during manufacture of the assembly, non-conductive adhesive to flow through it.

17. An electronic circuit assembly comprising a first electronic circuit module in accordance with any preceding clause, a second electronic circuit module comprising a second surface and a second electrical contact provided on said second surface, and a quantity of anisotropic conductive adhesive, ACA, comprising a plurality of electrically conductive particles and an electrically non-conductive adhesive, occupying a volume between the first and second surfaces, the first surface facing the second surface and the first contact being aligned with the second contact such that conductive particles of the ACA form an electrical connection between the first and second contacts.

18. An assembly in accordance with clause 17, wherein at least one channel of the raised perimeter barrier has a width not exceeding X, the assembly comprising a first plurality of said electrically conductive particles, each having a minimum dimension greater than X, inside said volume and inside (within) the raised perimeter barrier.

19. An assembly in accordance with clause 18, wherein an average minimum (smallest) dimension of the electrically conductive particles of said quantity of ACA is greater than X.

20. An assembly in accordance with any one of clauses 17 to 19, wherein a numerical density of said electrically conductive particles is greater inside the raised perimeter barrier than in an area of the first surface outside the raised perimeter barrier.

21. A method of manufacturing an electronic circuit assembly, the method comprising:

providing a first electronic circuit module as defined by any one of clauses 1 to 16;

providing a second electronic circuit module comprising a second surface and a second electrical contact provided on said second surface;

applying a quantity of ACA, comprising a plurality of electrically conductive particles and a non-conductive adhesive, to (over) a region of the first surface inside (within) the raised perimeter barrier (which may, of course, comprise at least partially covering the first contact with ACA) or to (over) the second electrical contact;

arranging said first surface to face said second surface, with the first electrical contact aligned with the second electrical contact such that the first electrical contact opposes the second electrical contact;

urging the first surface and second surface together such that a portion of the non-conductive adhesive of the ACA flows out of the raised perimeter barrier via at least one said channel, said quantity of ACA occupies a volume between the first and second surfaces, and conductive particles of the ACA provide an electrical connection between the first electrical contact and the second electrical contact.

22. A method in accordance with clause 21, wherein at least one channel of the raised perimeter barrier has a width not exceeding X, and at least a portion of said plurality of electrically conductive particles have a minimum (smallest) dimension (e.g. diameter) greater than X.

23. A method in accordance with clause 22, wherein each channel of the raised perimeter barrier has a width not exceeding X.

24. A method in accordance with clause 22 or clause 23, wherein an average minimum dimension of said plurality of electrically conductive particles is greater than X.

The invention claimed is:

1. An electronic circuit module comprising a first surface and a first electrical contact provided on said first surface, for bonding to a second electronic circuit module comprising a second surface and a second electrical contact provided on said second surface to form an electronic circuit assembly by providing a quantity of anisotropic conductive adhesive, ACA, comprising a plurality of electrically conductive particles and an electrically non-conductive adhesive, between the first and second surfaces and urging said surfaces towards each other, with said contacts aligned such that conductive particles form an electrical connection between the first and second contacts, the electronic circuit module further comprising at least one perimeter member provided on and protruding from said first surface and spaced from the first electrical contact and arranged to provide a raised perimeter barrier around the first electrical contact, said raised perimeter barrier comprising at least one channel provided through a said perimeter member, each said channel located between respective ends of the perimeter member and providing a flow channel arranged to permit, during manufacture of the assembly, a portion of the non-conductive adhesive of a quantity of ACA deposited inside the raised perimeter barrier to flow out of the raised perimeter barrier to an area outside the raised perimeter barrier, and arranged to inhibit, during manufacture of the assembly, flow of the conductive particles of said quantity of ACA deposited inside the raised perimeter barrier, wherein the at least one perimeter member comprises a first perimeter member having a surface in which a plurality of surface channels are provided, each surface channel having a depth smaller than a thickness of the first perimeter member and being arranged to permit flow of the non-conductive adhesive through it, during manufacture of the assembly, from one side of the first perimeter member to an opposite side of the first perimeter member.

2. The module in accordance with claim 1, wherein each said channel has a width not exceeding X, such that each channel is arranged to inhibit or prevent flow through it, during manufacture of the assembly, of conductive particles of said quantity of ACA having a minimum dimension greater than X out of the raised perimeter barrier.

3. The module in accordance with claim 1, wherein the first electrical contact protrudes from said first surface.

4. The module in accordance with claim 3, wherein the first electrical contact and each perimeter member protrudes from the first surface by the same distance.

5. The module in accordance with claim 1, wherein at least one groove or surface channel is provided in a surface of the first electrical contact.

6. The module in accordance with claim 1, wherein a surface of the first electrical contact is provided with at least one groove, surface channel, depression, hollow, or window down to the first surface, for trapping conductive particles of the ACA.

7. The module in accordance with claim 1, wherein the first electrical contact comprises a plurality of first electrical contact members, each arranged inside the raised perimeter barrier.

8. The module in accordance with claim 7, wherein the plurality of first electrical contact members are arranged in a plurality of rows and a plurality of columns.

9. The module in accordance with claim 1, wherein the first perimeter member encloses the first contact.

10. The module in accordance with claim 1, further comprising a further electrical contact provided on said first surface, wherein said at least one channel comprises at least one channel arranged to permit, during manufacture of the assembly, a portion of the non-conductive adhesive of a quantity of ACA deposited inside the raised perimeter barrier to flow out of the raised perimeter barrier in a direction towards the further electrical contact.

11. The module in accordance with claim 10, further comprising at least one further perimeter member provided on and protruding from said first surface and spaced from the further electrical contact and arranged to provide a second raised perimeter barrier around the further electrical contact, said second raised perimeter barrier raised from the first surface, said second raised perimeter barrier comprising at least one further channel provided through a said further perimeter member or defined between a plurality of said further perimeter members, each said further channel providing a flow channel arranged to permit, during manufacture of the assembly, a portion of the non-conductive adhesive of a quantity of ACA deposited inside the second raised perimeter barrier to flow out of the second raised perimeter barrier.

12. The module in accordance with claim 10, further comprising at least one additional member, each additional member protruding from the first surface and being provided on said first surface in a region of the first surface between the first and further contacts.

13. The module in accordance with claim 12, further comprising at least one additional channel provided through a said additional member or defined between a plurality of said additional members, each said additional channel providing a flow channel arranged to permit, during manufacture of the assembly, non-conductive adhesive to flow through it.

14. An electronic circuit assembly comprising a first electronic circuit module in accordance with claim 1, a second electronic circuit module comprising a second surface and a second electrical contact provided on said second surface, and a quantity of ACA comprising a plurality of electrically conductive particles and an electrically non-conductive adhesive, occupying a volume between the first and second surfaces, the first surface facing the second surface and the first contact being aligned with the second contact such that conductive particles of the ACA form an electrical connection between the first and second contacts.

15. The assembly in accordance with claim 14, wherein a numerical density of said electrically conductive particles is greater inside the raised perimeter barrier than in an area of the first surface outside the raised perimeter barrier.

16. An electronic circuit module comprising a first surface and a first electrical contact provided on said first surface, for bonding to a second electronic circuit module comprising a second surface and a second electrical contact provided on said second surface to form an electronic circuit assembly by providing a quantity of anisotropic conductive adhesive, ACA, comprising a plurality of electrically conductive particles and an electrically non-conductive adhesive, between the first and second surfaces and urging said surfaces towards each other, with said contacts aligned such that conductive particles form an electrical connection between the first and second contacts, the electronic circuit module further comprising at least one perimeter member provided on and protruding from said first surface and spaced from the first electrical contact and arranged to provide a raised perimeter barrier around the first electrical contact, said raised perimeter barrier comprising at least one channel provided through a said perimeter member, each said channel located between respective ends of the perimeter member and providing a flow channel arranged to permit, during manufacture of the assembly, a portion of the non-conductive adhesive of a quantity of ACA deposited inside the raised perimeter barrier to flow out of the raised perimeter barrier to an area outside the raised perimeter barrier, and arranged to inhibit, during manufacture of the assembly, flow of the conductive particles of said quantity of ACA deposited inside the raised perimeter barrier, the module further comprising:

a further electrical contact provided on said first surface, wherein said at least one channel comprises at least one channel arranged to permit, during manufacture of the assembly, a portion of the non-conductive adhesive of a quantity of ACA deposited inside the raised perimeter barrier to flow out of the raised perimeter barrier in a direction towards the further electrical contact; and at least one further perimeter member provided on and protruding from said first surface and spaced from the further electrical contact and arranged to provide a second raised perimeter barrier around the further electrical contact, said second raised perimeter barrier raised from the first surface, said second raised perimeter barrier comprising at least one further channel provided through a said further perimeter member or defined between a plurality of said further perimeter members, each said further channel providing a flow channel arranged to permit, during manufacture of the assembly, a portion of the non-conductive adhesive of a quantity of ACA deposited inside the second raised perimeter barrier to flow out of the second raised perimeter barrier.

* * * * *